US012660180B2

(12) United States Patent
Scarbrough et al.

(10) Patent No.:  US 12,660,180 B2
(45) Date of Patent:        Jun. 16, 2026

(54) METHODS USED IN FORMING A MEMORY ARRAY COMPRISING STRINGS OF MEMORY CELLS AND THROUGH-ARRAY VIAS IN A THROUGH-ARRAY-VIA REGION WHEREIN TAV OPENINGS AND HORIZONTALLY-ELONGATED TRENCHES ARE FORMED OR WHEREIN TAV CONSTRUCTIONS COMPRISE FIRST AND SECOND NON-CONDUCTIVE CYLINDERS

(71) Applicant: Micron Technology, Inc., Boise, ID (US)

(72) Inventors: Alyssa N. Scarbrough, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 773 days.

(21) Appl. No.: 17/746,202

(22) Filed: May 17, 2022

(65) Prior Publication Data

US 2023/0380158 A1     Nov. 23, 2023

(51) Int. Cl.
H10B 43/27        (2023.01)
H10B 41/27        (2023.01)

(52) U.S. Cl.
CPC ............. H10B 43/27 (2023.02); H10B 41/27 (2023.02)

(58) Field of Classification Search
CPC ......... H10B 43/27; H10B 41/27; H10B 43/10
See application file for complete search history.

(56) References Cited

U.S. PATENT DOCUMENTS

| | | | |
|---|---|---|---|
| 2019/0088671 A1* | 3/2019 | Greenlee ................ | H10B 43/10 |
| 2020/0168622 A1* | 5/2020 | Fukuzumi .............. | H10B 43/10 |
| 2020/0402890 A1* | 12/2020 | Chary .................... | H10B 41/10 |
| 2021/0013221 A1* | 1/2021 | Daycock ................ | H10B 41/27 |

* cited by examiner

*Primary Examiner* — Norman D Richards
*Assistant Examiner* — Ethan Edward Cutler
(74) *Attorney, Agent, or Firm* — Wells St. John P.S.

(57)            ABSTRACT

A method used in forming a memory array comprising strings of memory cells comprises forming a stack comprising vertically-alternating first tiers and second tiers. The stack comprises laterally-spaced memory-block regions and a through-array-via (TAV) region. The stack comprises channel-material strings extending through the first tiers and the second tiers. The stack comprises horizontally-elongated trenches extending through the first tiers and the second tiers and that are individually between immediately-laterally-adjacent of the memory-block regions. The stack comprises TAV openings in the TAV region. Conductive material is formed in the TAV openings and in the horizontally-elongated trenches at the same time. All of the conductive material is removed from the horizontally-elongated trenches while leaving the conductive material in the TAV openings to comprise TAVs therein in a finished circuitry construction. After the removing, intervening material is formed in the horizontally-elongated trenches. Other embodiments, including structure, are disclosed.

10 Claims, 25 Drawing Sheets

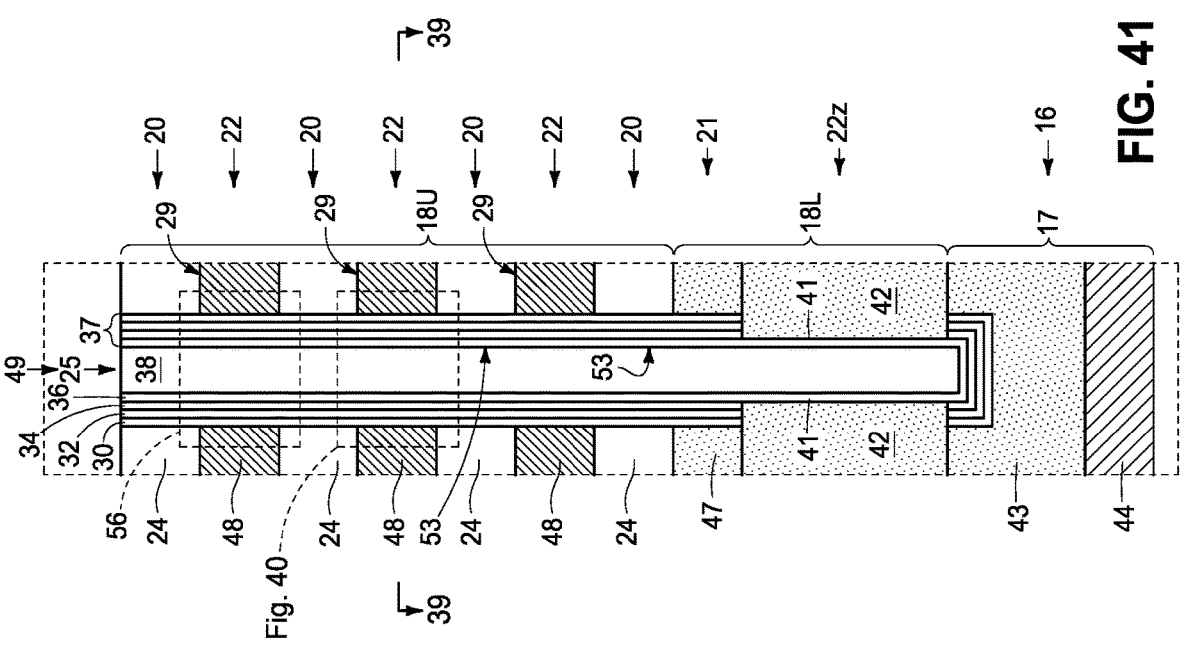
FIG. 41
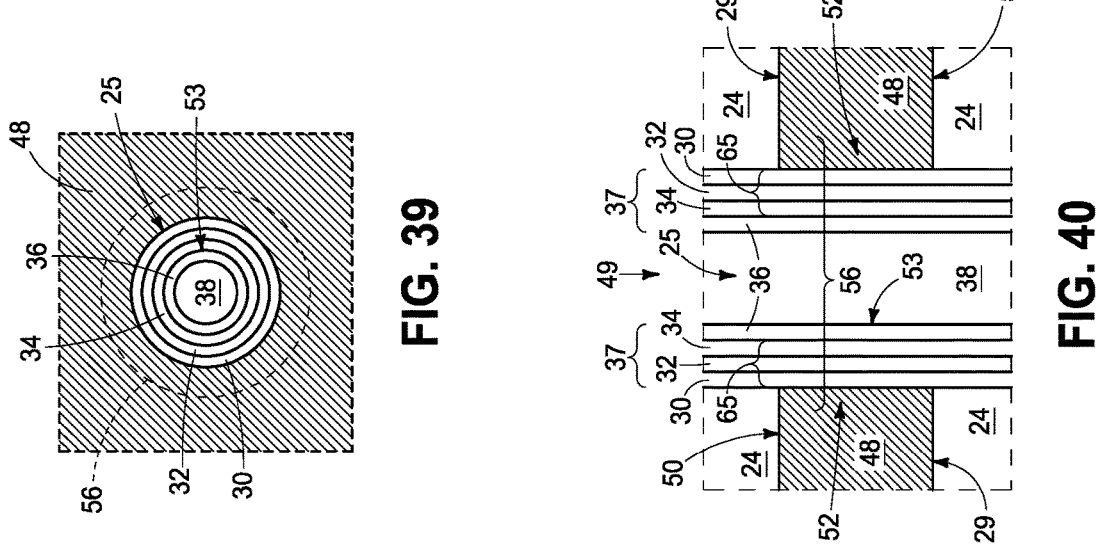
FIG. 39
FIG. 40

METHODS USED IN FORMING A MEMORY ARRAY COMPRISING STRINGS OF MEMORY CELLS AND THROUGH-ARRAY VIAS IN A THROUGH-ARRAY-VIA REGION WHEREIN TAV OPENINGS AND HORIZONTALLY-ELONGATED TRENCHES ARE FORMED OR WHEREIN TAV CONSTRUCTIONS COMPRISE FIRST AND SECOND NON-CONDUCTIVE CYLINDERS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 5-46 are diagrammatic sequential sectional and/or enlarged views of the construction of FIGS. 2-4, or portions thereof or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-46 which may be considered as "gate-last" or "replacement-gate" processing. Further, and regardless, the following sequence of processing steps is but one example and other sequences of the example processing steps (with or without other processing steps) may be used regardless of whether using "gate-last/replacement-gate" processing.

Figure 1:
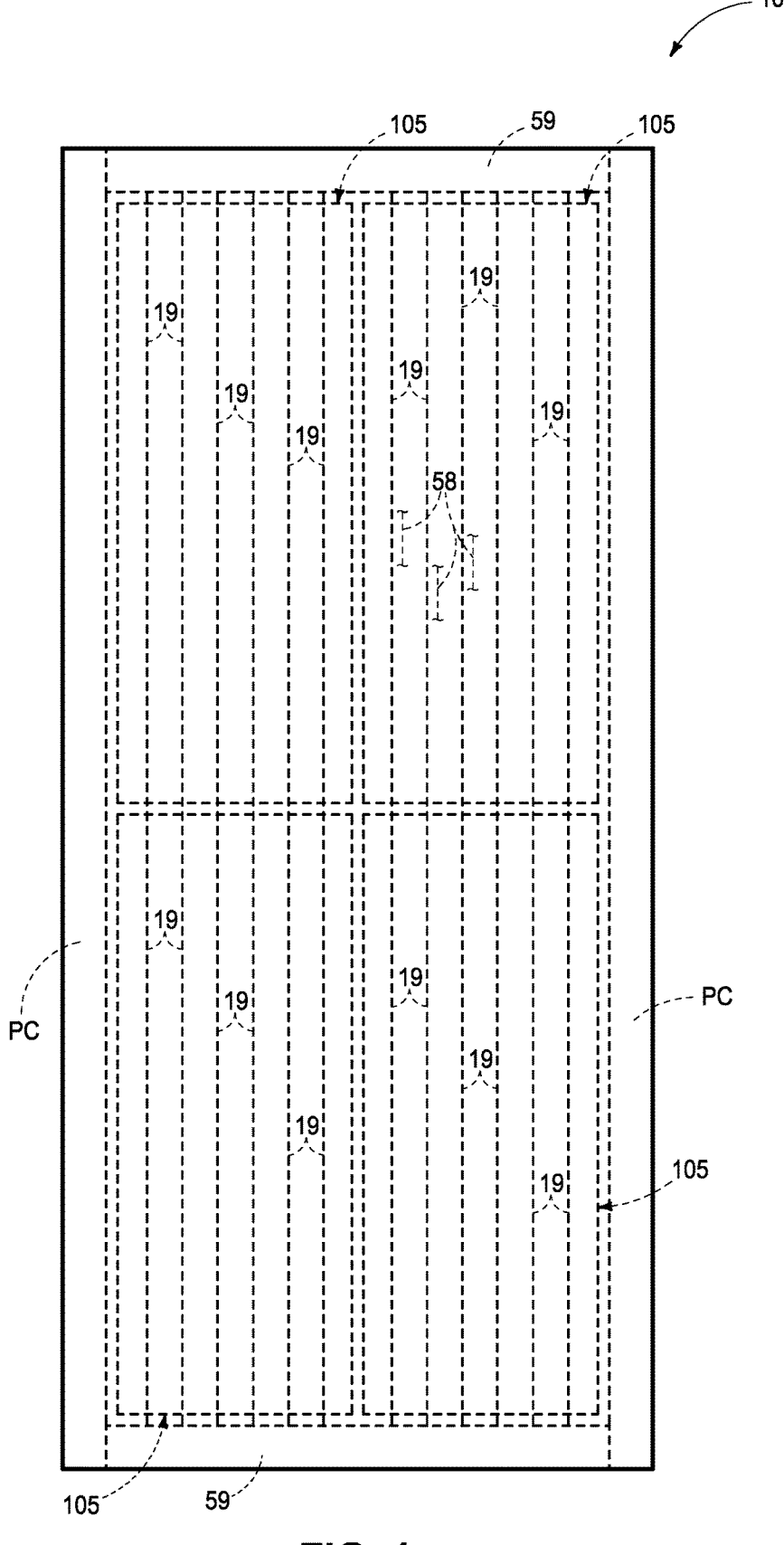
FIG. 1 is a diagrammatic top plan view of a die or die area that may be part of a larger substrate (e.g., a semiconductor wafer, and not shown).
Figures 2, 3:
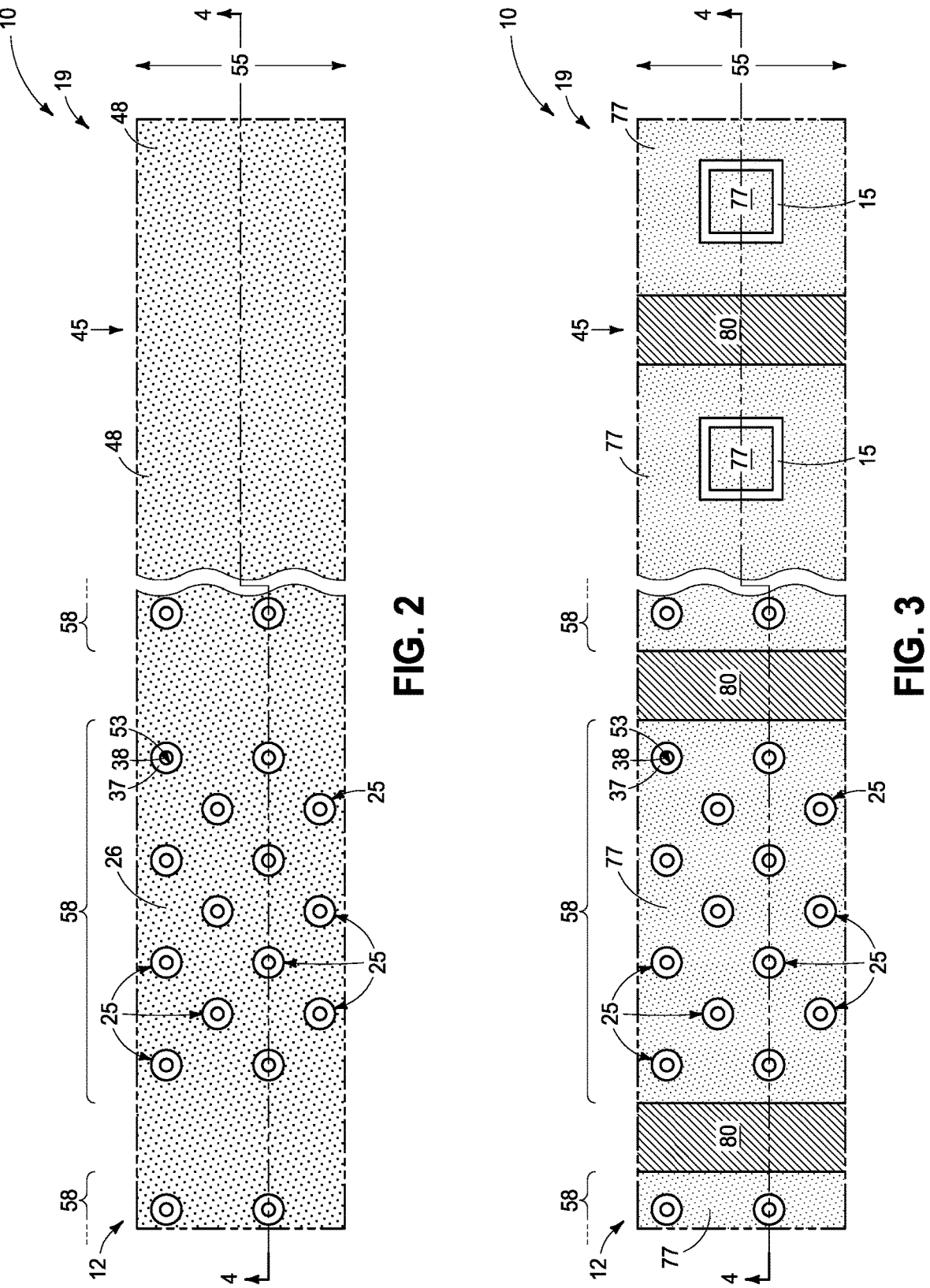
FIGS. 2-4 are diagrammatic cross-sectional views of portions of a construction (e.g., as part of FIG. 1) that will comprise an array of elevationally-extending strings of memory cells in accordance with an embodiment of the invention.
Figure 4:
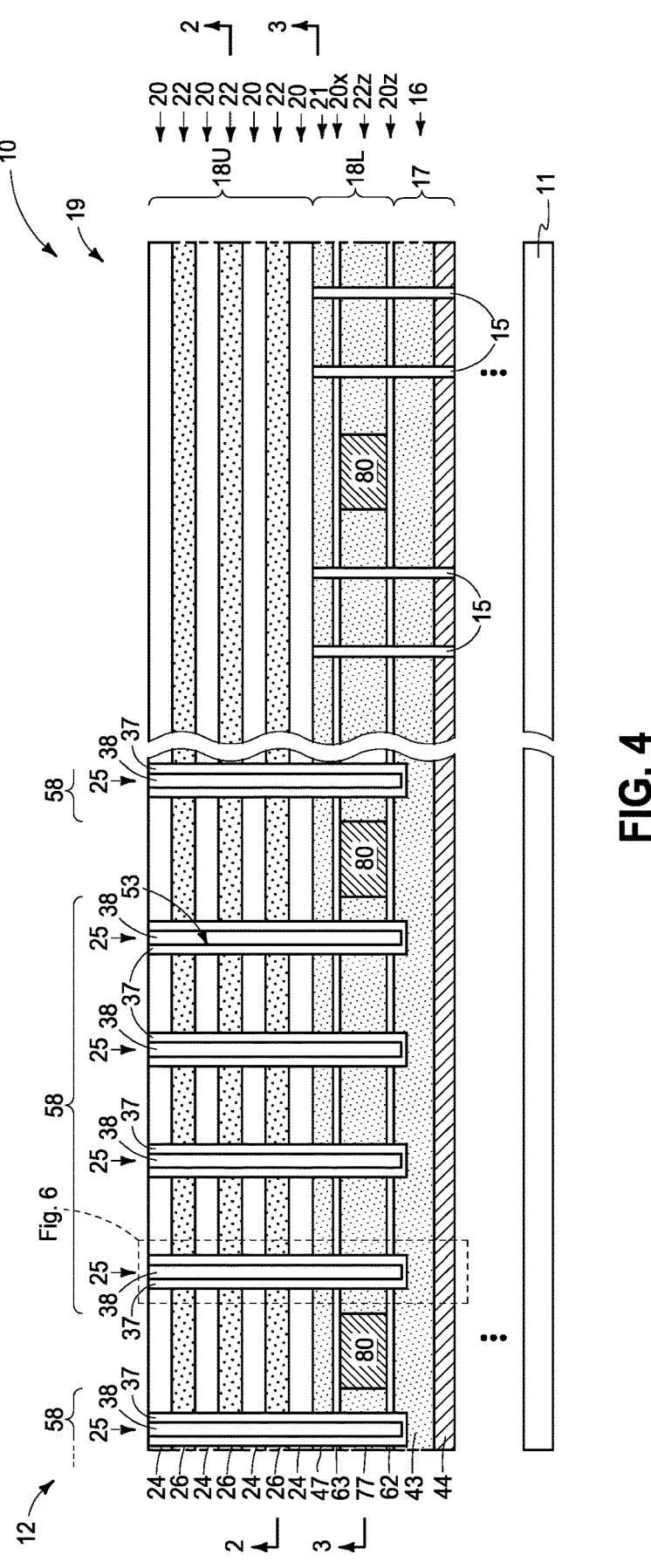
Figure 6:
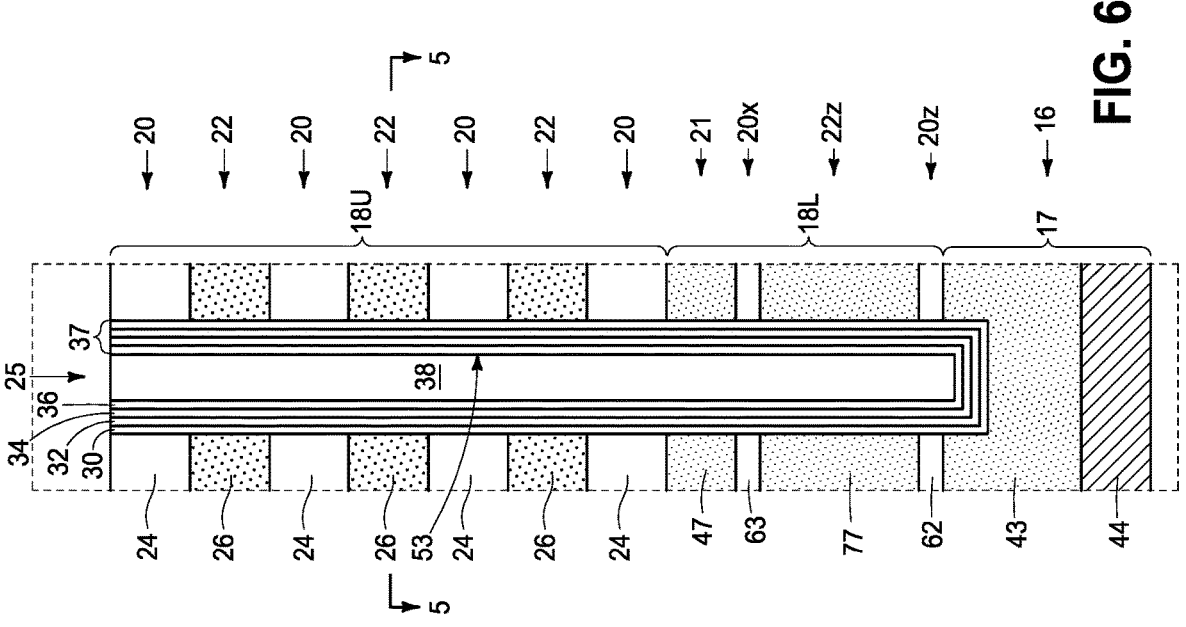
Figure 5:
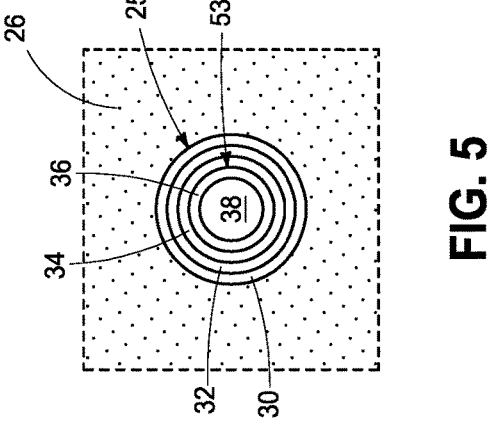

FIG. 1 shows an example diagrammatic embodiment comprising a die or die area 100 that may be part of a larger substrate (e.g., a semiconductor wafer, and not shown) and in which a memory array will be fabricated. Example die area 100 comprises at least one memory-plane region 105 (four being shown), memory-block regions 58 in individual memory-plane regions 105, a stair-step region 59 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 59, and/or PC may not be discernable at this point of processing. FIGS. 2-6 are diagrammatic larger scale views of portions of die area 100.

Referring to FIGS. 2-6, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack and between electronic components at different elevations in a finished construction of integrated circuitry that has been or is being fabricated (e.g., through a stack 18* described below; an * being used as a suffix to be inclusive of all such same-numerically-designated components that may or may not have other suffixes). A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 59). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, or a combination of in-plane and out-of-plane. A TAV region may be in a memory-block region (not shown).

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2 and 3-depicted materials. For example, other partially or wholly fabricated components of integrated circuitry may be provided somewhere above, about, or in base substrate 11. Control and/or other peripheral circuitry for operating components in an array (e.g., array 12 or memory-array region 12) of elevationally-extending strings of memory cells may also be fabricated and may or may not be wholly or partially in an array or sub-array. Further, multiple sub-arrays may also be fabricated and operated independently, in tandem, or otherwise relative one another. In this document, a "sub-array" may also be considered as an array.

In one embodiment, a conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises conductive metal material (e.g., a metal silicide such as WSi$_x$). Conductor tier 16 may comprise part of control circuitry (e.g., peripheral-under-array circuitry and/or a common source line or plate) used to control read and write access to the transistors and/or memory cells that will be formed in array 12.

A lower portion 18L of a stack 18* has been formed directly above conductor tier 16 (when present) and substrate 11. Stack 18* will comprise vertically-alternating conductive tiers 22* and insulative tiers 20*. Lower portion 18L and conductor tier 16 collectively comprise laterally-spaced memory-block regions 58 that will comprise laterally-spaced memory blocks 58 in a finished circuitry construction and comprise TAV region 19. Memory-block regions 58 and resultant memory blocks 58 (not yet shown) may be considered as being longitudinally elongated and oriented, for example horizontally-parallel relative one another, along a direction 55.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., in array region 12; e.g., comprising material 62, for example silicon dioxide and/or silicon nitride). A next-lowest second tier 20x of second tiers 20* is directly above lowest second tier 20z and may be sacrificial (e.g., in array region 12; e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. Example lower portion 18L comprises a conducting-material tier 21 comprising conducting material 47 (e.g., conductively-doped polysilicon) that is directly above next-lowest second tier 20x. Additional tiers may be present. For example, one or more additional tiers may be above tier 21 (tier 21 thereby not being the uppermost tier in portion 18L, and not shown), between tier 21 and 20x (not shown), and/or below tier 22z (other than 20z not being shown).

In one embodiment, sacrificial horizontally-elongated lines 80 have been formed in lowest first tier 22z and are individually laterally-between and along immediately-laterally-adjacent of laterally-spaced memory-block regions 58 (e.g., formed before forming materials 63 and 47). Such may also be in TAV region 19 as shown. By way of examples, such may comprise a metal-material core (e.g., W, Ti, Co, Ta, a tungsten nitride, a titanium nitride, a cobalt nitride, a tantalum nitride, a tungsten silicide, a titanium silicide, a cobalt silicide, a tantalum silicide) having an insulative-material lining (e.g., not shown; e.g., silicon dioxide and/or silicon nitride).

In one embodiment, insulative rings 15 (e.g., silicon dioxide, silicon nitride, and/or aluminum oxide) have been formed vertically through lower portion 18L of stack 18* in TAV region 19 circumferentially around horizontal locations where individual TAVs will be formed. In one embodiment and as shown, insulative material 15 is formed through conductor tier 16.

An upper portion 18U of stack 18* has been formed directly above lower portion 18L of stack 18*. Example upper portion 18U comprises vertically-alternating different composition first tiers 22 and second tiers 20. First tiers 22 may be conductive and second tiers 20 may be insulative, yet need not be so at this point of processing in conjunction with the hereby initially-described example method embodiment which is "gate-last" or "replacement-gate". Example first tiers 22 and second tiers 20 comprise different composition materials 26 and 24 (e.g., silicon nitride and silicon dioxide), respectively. Example upper portion 18U is shown starting above lower portion 18L with a second tier 20 although such could alternately start with a first tier 22 (not shown) or tier 21 may be considered as being in upper portion 18U (not so designated). Further, and by way of example, lower portion 18L may be formed to have one or more first and/or second tiers as a top thereof. Regardless, only a small number of tiers 20 and 22 is shown, with more likely upper portion 18U (and thereby stack 18*) comprising dozens, a hundred or more, etc. of tiers 20 and 22. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22 and/or above an uppermost of conductive tiers 22. For example, one or more select gate tiers (not shown) may be between conductor tier 16 and lowest conductive tier 22 and one or more select gate tiers may be above an uppermost of conductive tiers 22. Alternately or additionally, at least one of the depicted uppermost and lowest conductive tiers 22 may be a select gate tier.

Channel openings 25 have been formed (e.g., by etching) through second tiers 20* and first tiers 22* in upper portion 18U to lower portion 18L (e.g., at least to lowest first tier 22z in lower portion 18L). Channel openings 25 may taper radially-inward or radially-outward (not shown) moving deeper into stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and in individual openings 25 followed by planarizing such back at least to a top surface of stack 18*.

Channel material 36 as a channel-material string 53 has also been formed in channel openings 25 elevationally along insulative tiers 20 and conductive tiers 22 in memory-block regions 58. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 or may occur with respect to only some. Alternately, and by way of example only, no punch etching may be conducted and channel material 36 may be directly electrically coupled to conductor material 17 of conductor tier 16 only by a separate conductive interconnect (not yet shown). A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown).

Figures 7, 8:
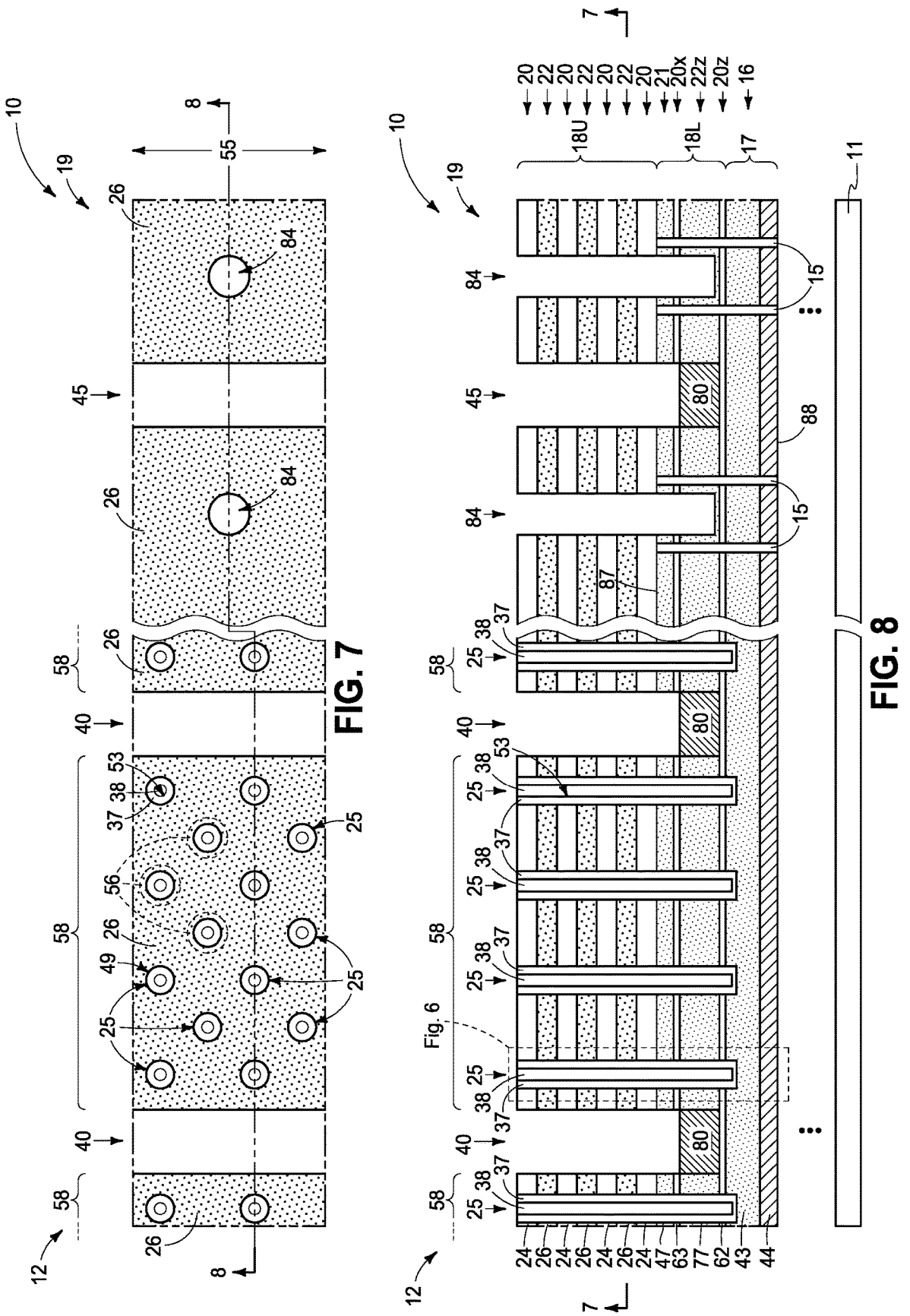

Referring to FIGS. 7 and 8, and in one embodiment, in a common masking step (i.e., common to the forming of [a] and [b]]), (a) and (b) have been formed at the same time (e.g., by anisotropic etching), where, (a): horizontally-elongated trenches 40 through first tiers 22 and second tiers 22 and that are individually between immediately-laterally-adjacent memory-block regions 58; and (b): TAV openings 84 through first tiers 22 and second tiers 20 in TAV region 19.

Example trenches 45 (one being shown) may also be formed in TAV region 19. Example trenches 40 and 45 are shown as having been formed to stop on lines 80 (when present). Example TAV openings 84 are shown as having been formed to stop within lowest first tier 22z. With respect to example construction 10, TAV openings 84 may be formed to stop anywhere from top 87 of conducting tier 21 to bottom 88 of conductor tier 16.

Figures 9, 10:
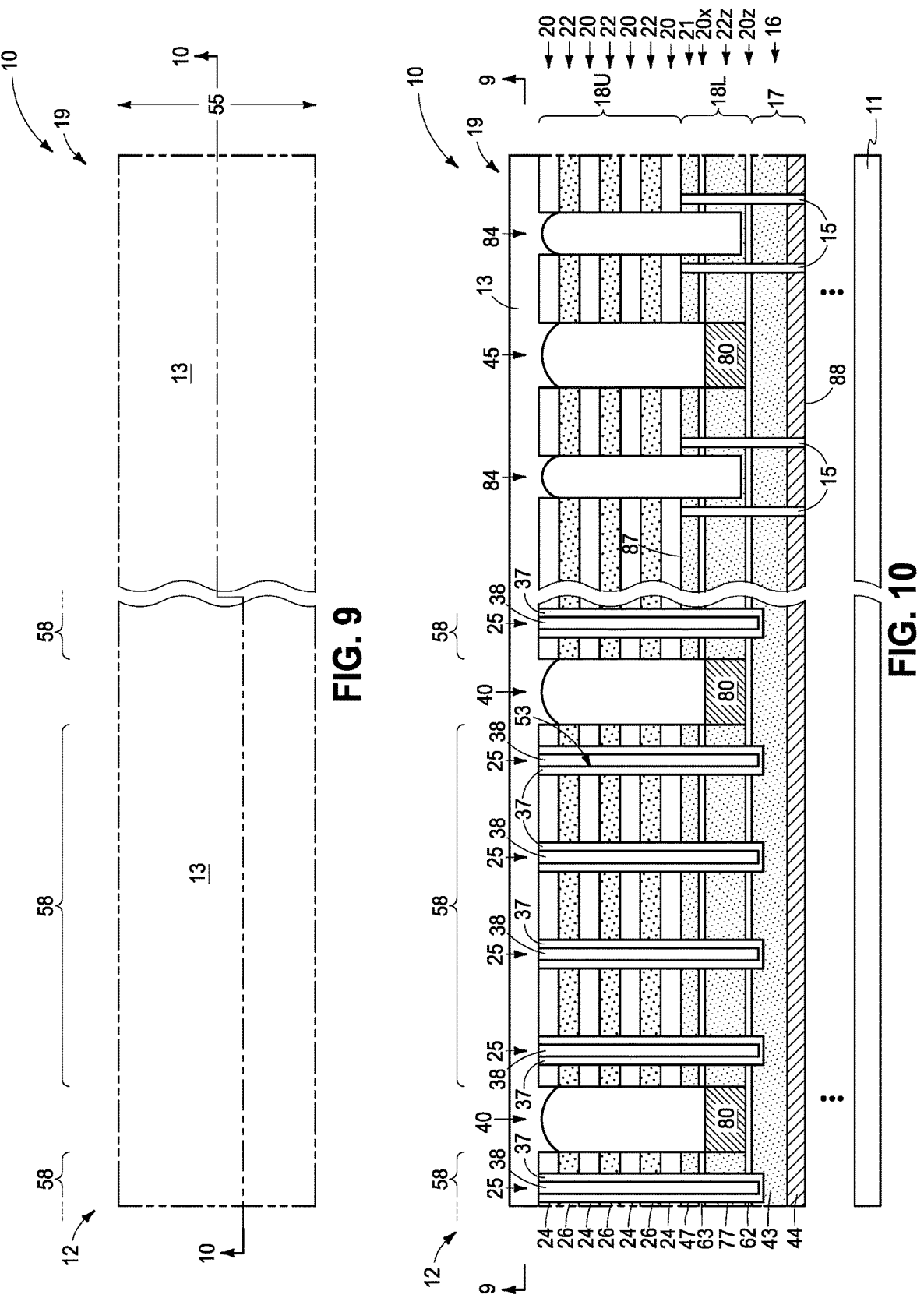
Figures 11, 12:
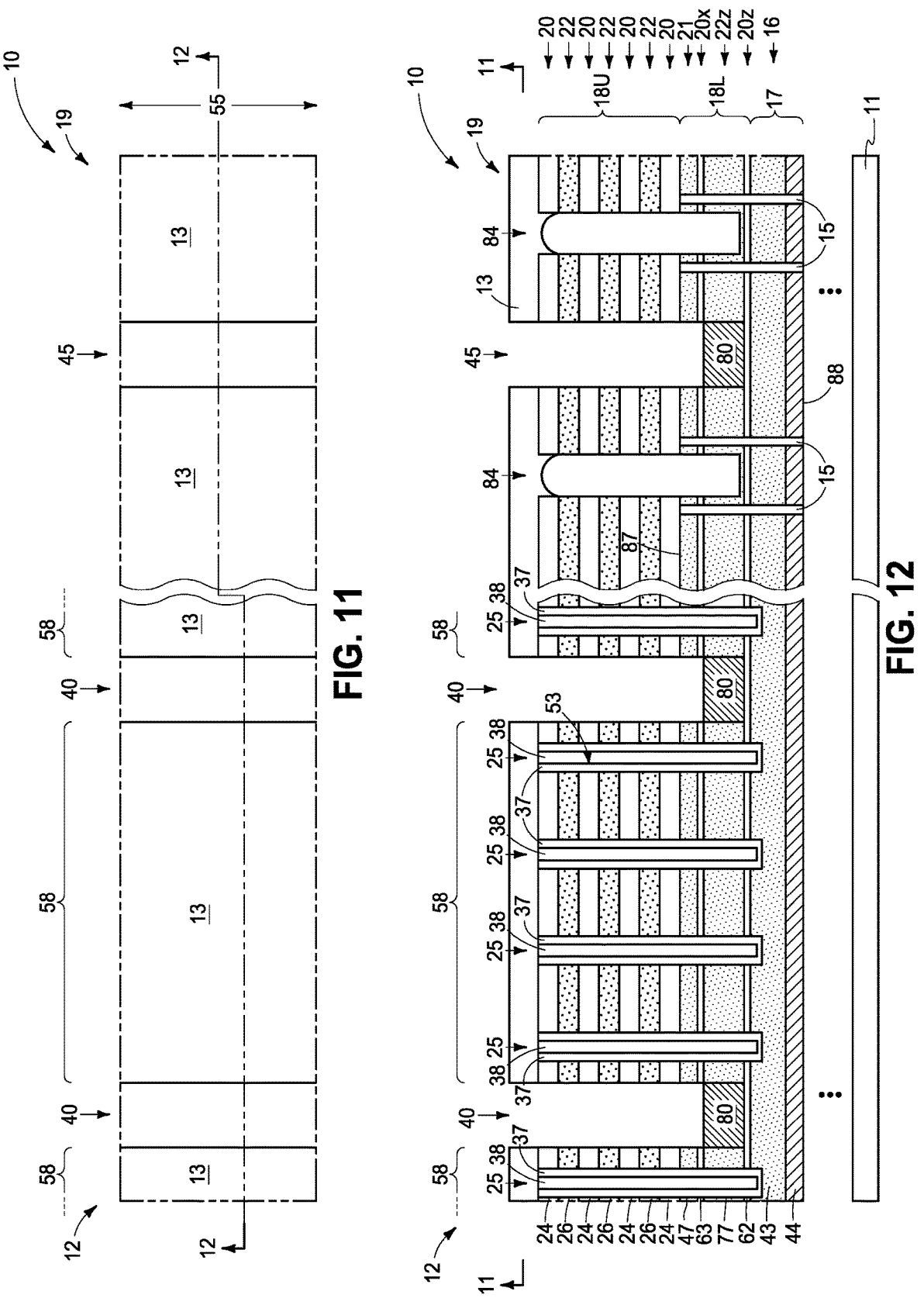

Referring to FIGS. 9 and 10, and in one embodiment, non-conformally-deposited masking material 13 (e.g., carbon, an oxide, a nitride, etc.) has been formed atop construction 10. FIGS. 11 and 12 show masking material 13 as having been removed from being atop trenches 40, 45 while leaving TAV openings 84 covered.

Figures 13, 14:
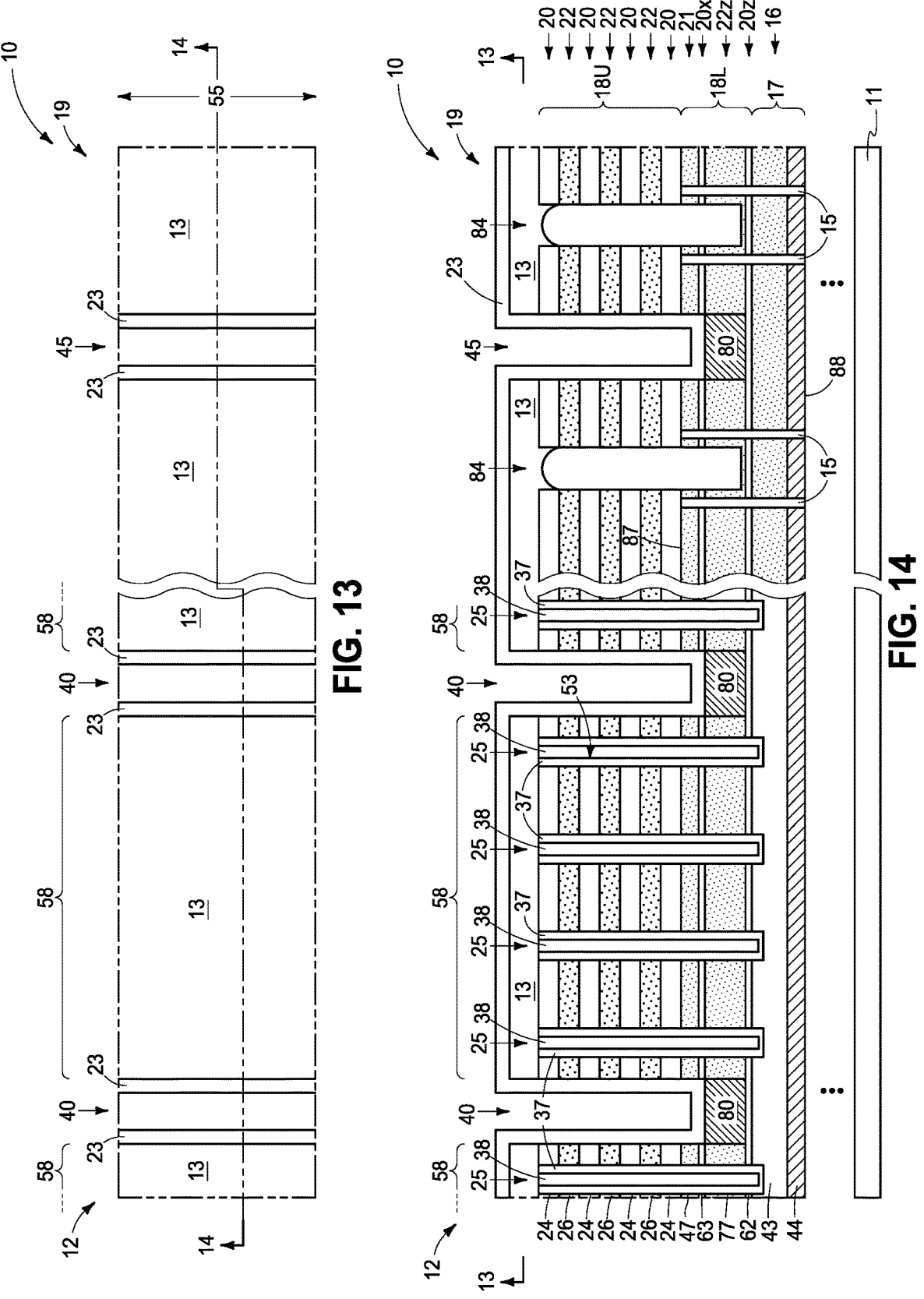

Referring to FIGS. 13 and 14, and in one embodiment, a lining 23 (e.g., comprising silicon nitride) has been formed over sidewalls of trenches 40 and of trenches 45 (when present) while TAV openings 84 are masked (e.g., by masking material 13) to preclude forming of such lining over sidewalls of TAV openings 84.

Figures 15, 16:
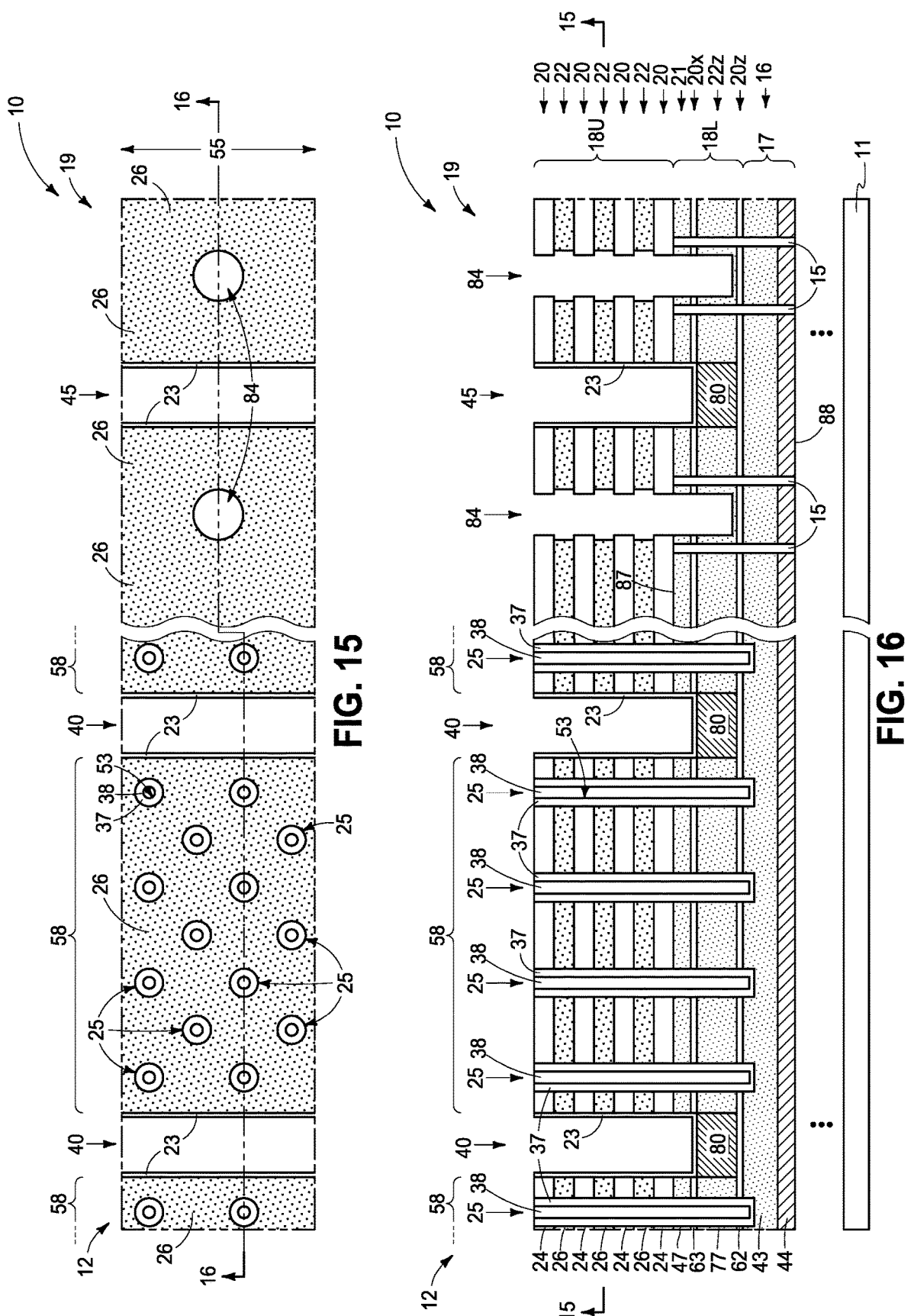

Referring to FIGS. 15 and 16, and in one embodiment, masking material 13 (not shown) has been removed whereby TAV openings 84 are unmasked. Thereafter, material 26 of first tiers 22 has been etched from within TAV openings 84 and such etching has also etched lining 23 in trenches 40 and in trenches 45 (when present). In one such embodiment and as shown, the etching of lining 23 has only etched some of such.

Figures 17, 18:
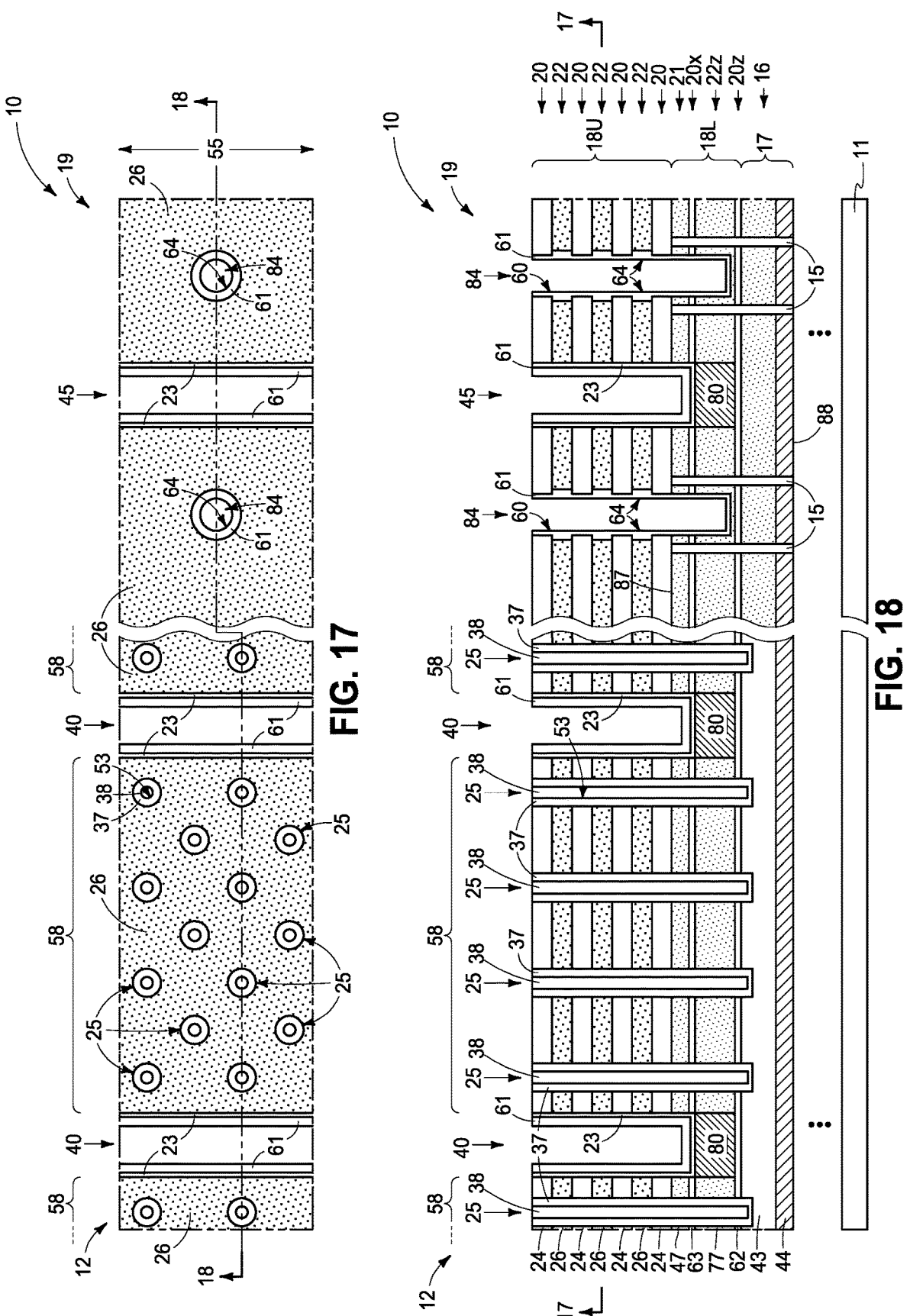
Figures 19, 20:
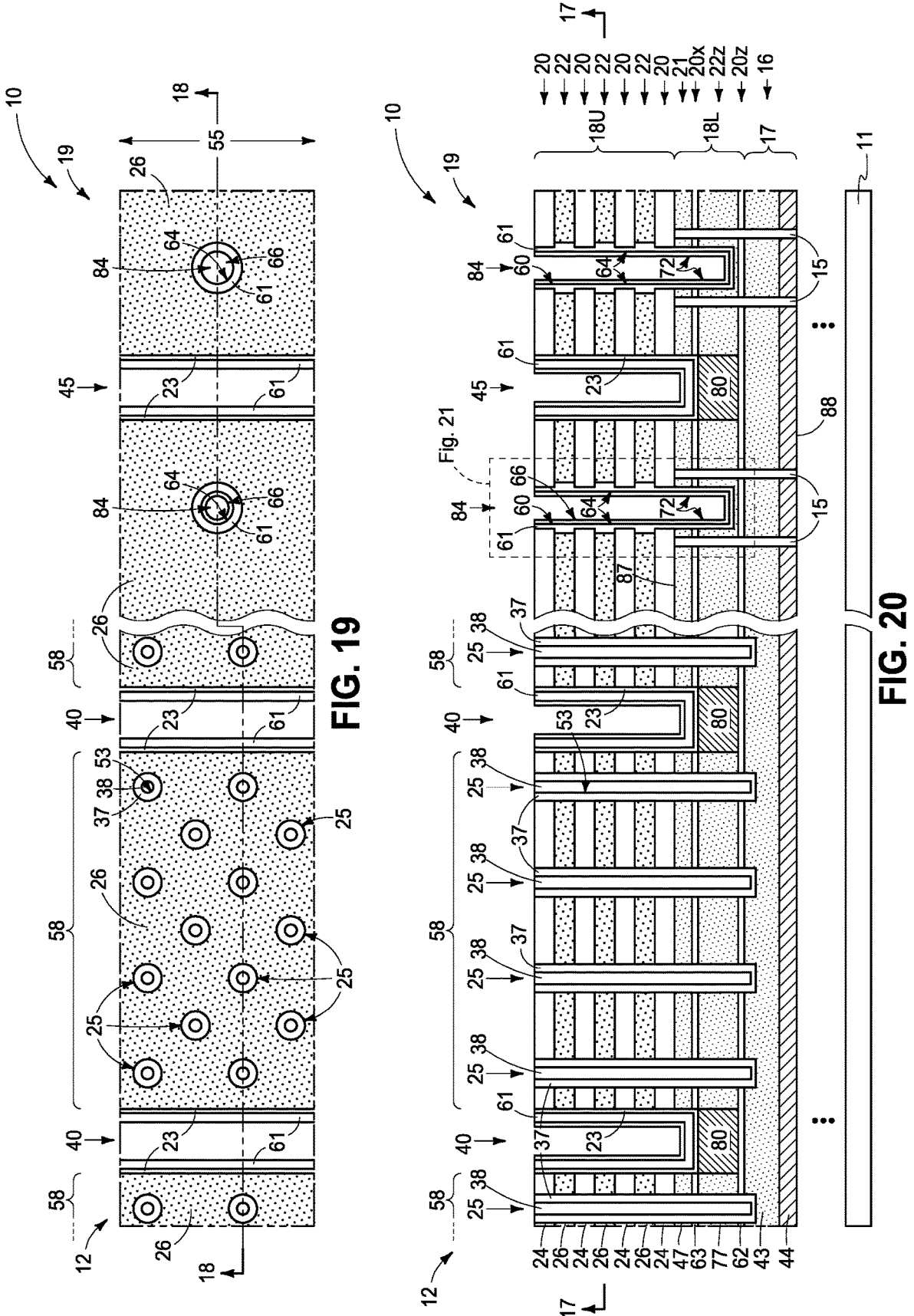
Figure 22:
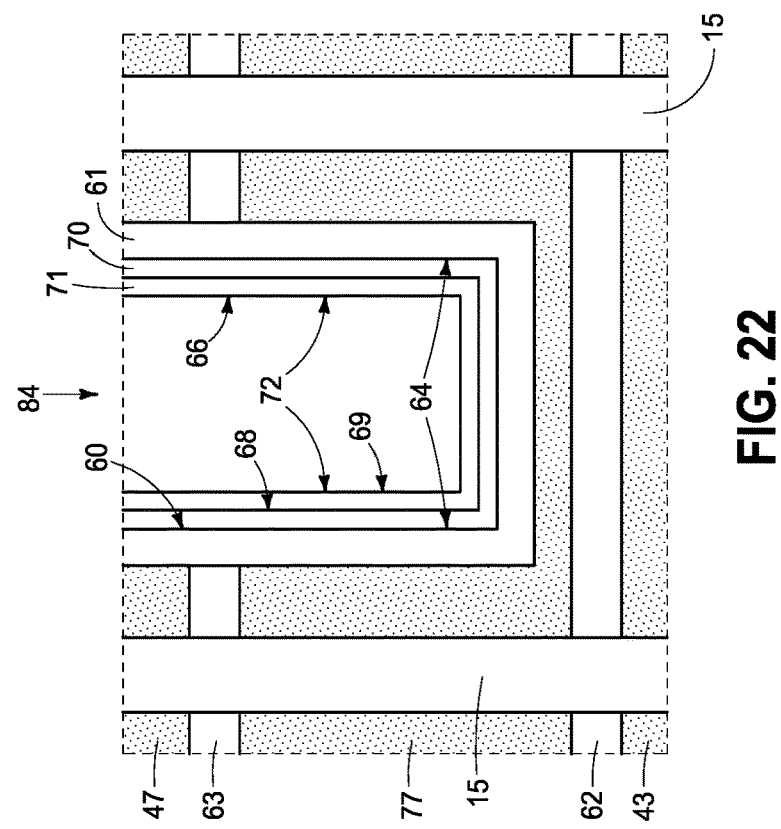
Figure 21:
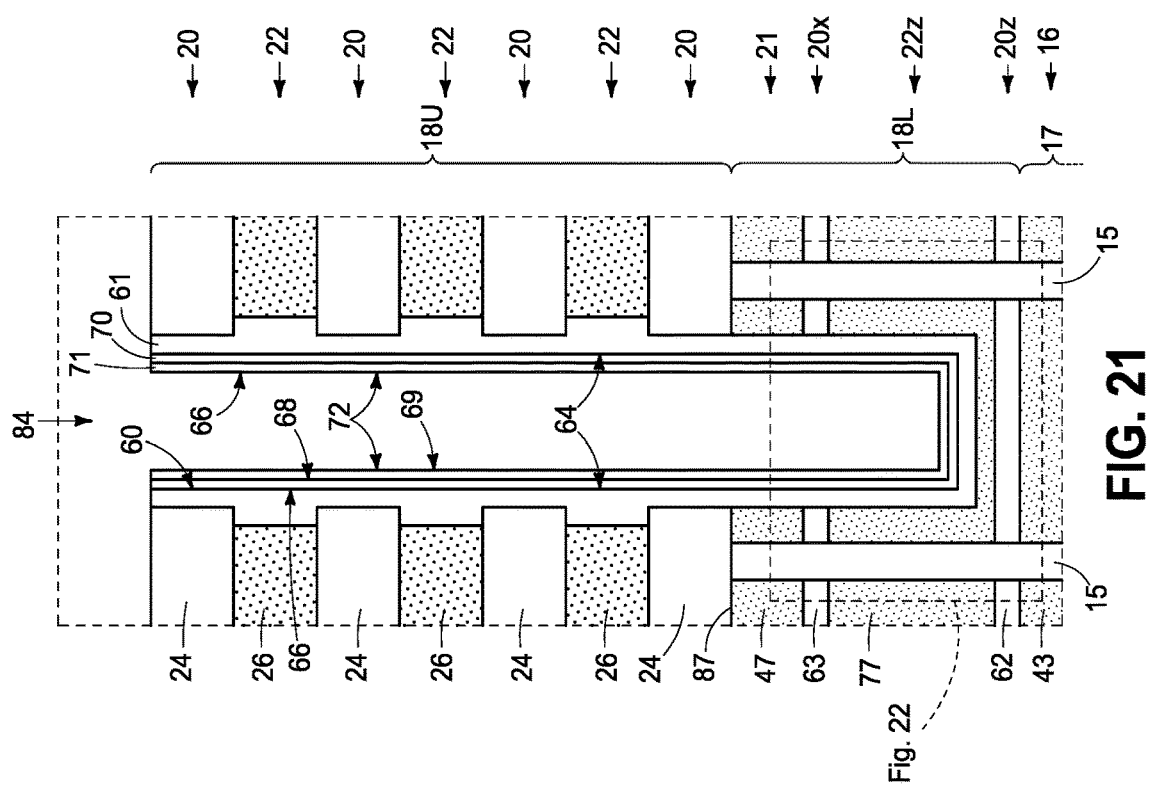
Figures 23, 24:
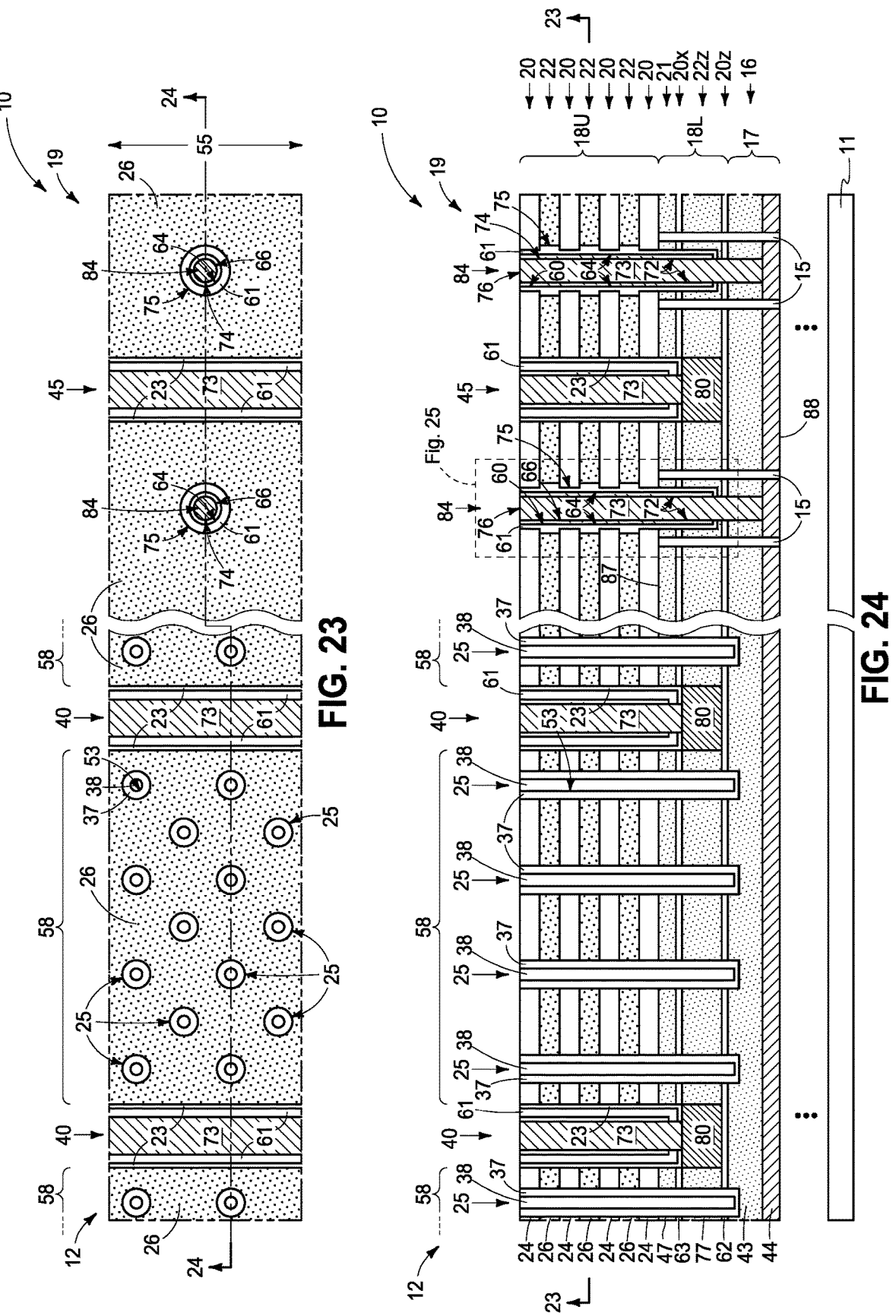
Figure 26:
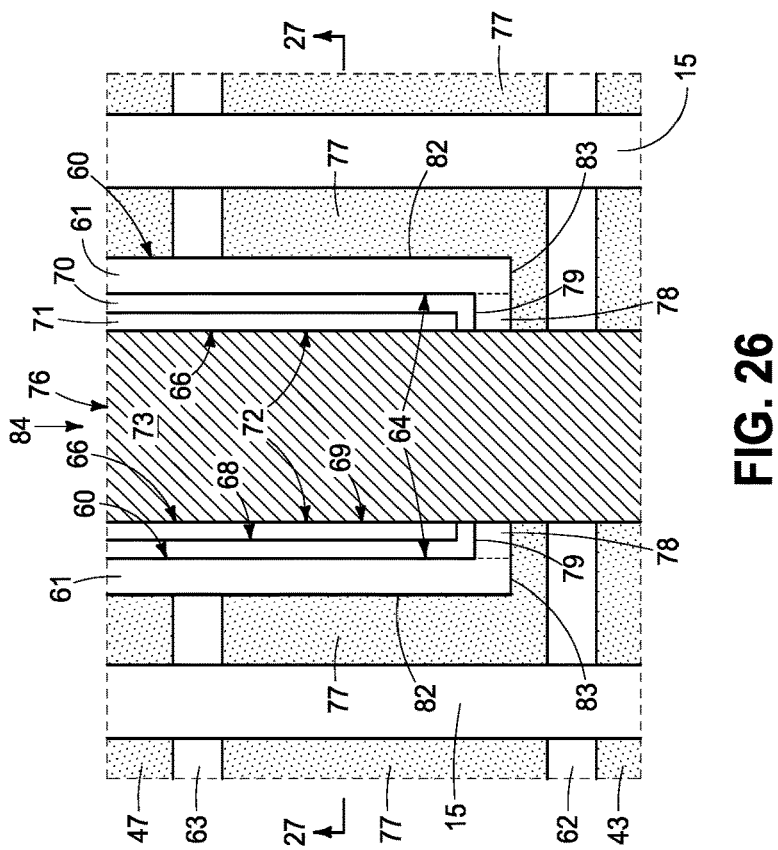
Figure 25:
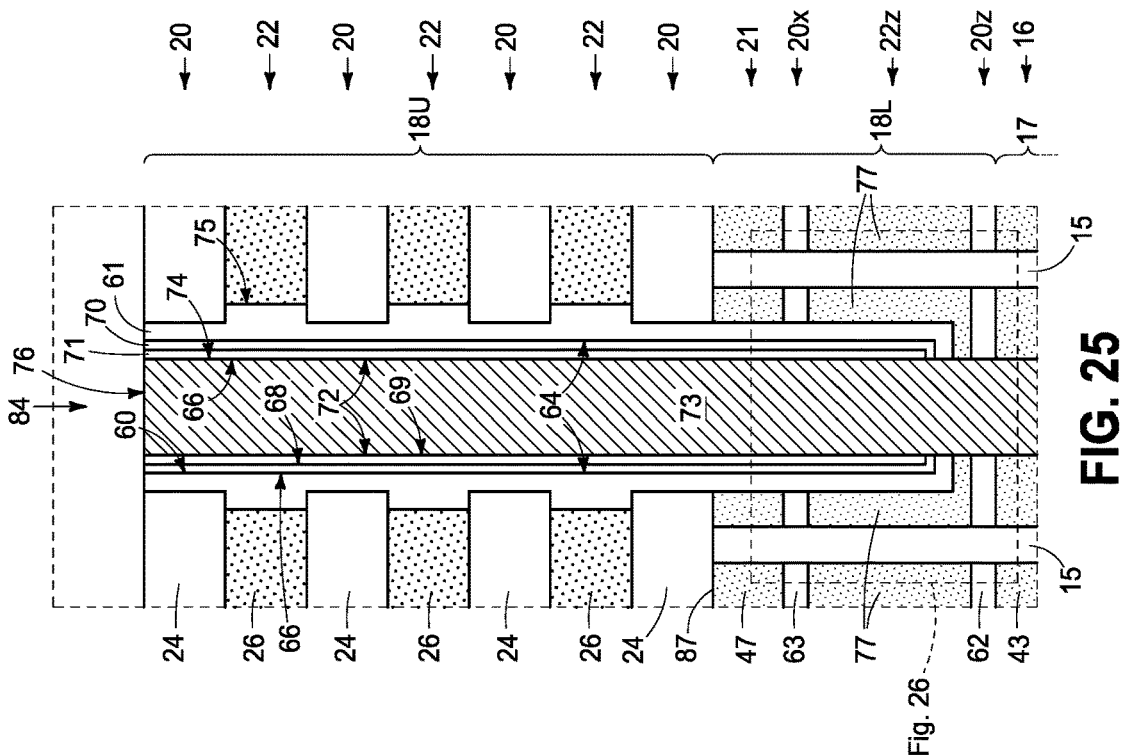
Figure 27:
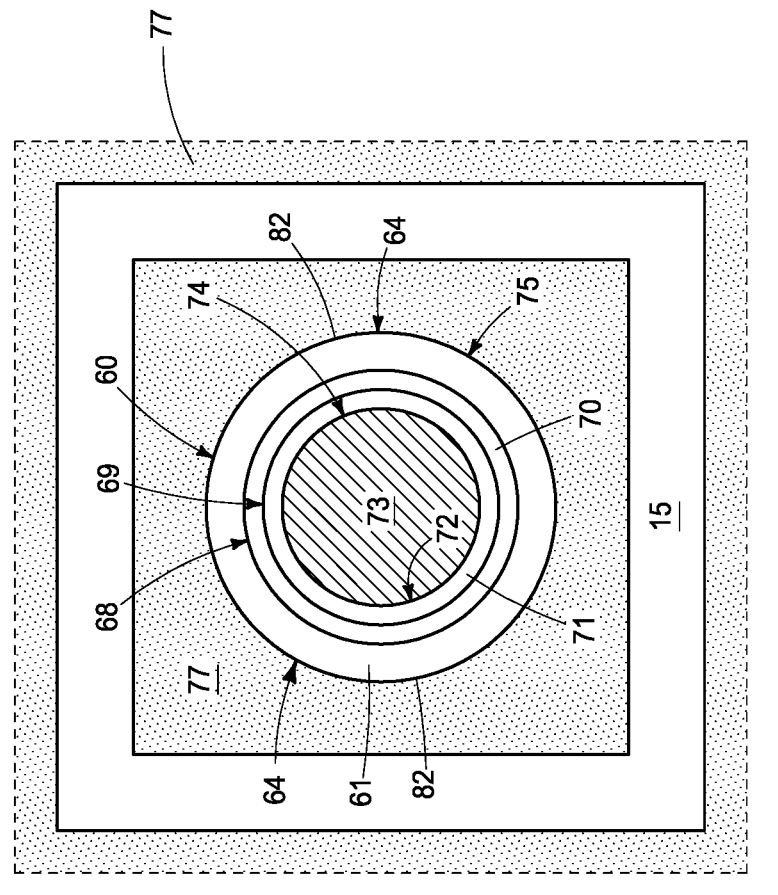

Referring to FIGS. 17 and 18, and in one embodiment, a second non-conductive cylinder 60 has been formed to extend through first tiers 22 and second tiers 20 in TAV openings 84 (regardless of whether material 26 was previously etched within TAV openings 84). Second non-conductive cylinder 60 in one embodiment is insulative and in another embodiment is semiconductive. Second non-conductive cylinder 60 comprises non-conductive material 61 (i.e., insulative material and/or semiconductive material). Ideally, non-conductive material 61 is of different composition from that of sacrificial material 77. Silicon dioxide, silicon nitride, aluminum oxide, and hafnium oxide are example insulative materials and undoped polysilicon is an example semiconductive material if sacrificial material 77 is not polysilicon. Non-conductive material 61 may also be formed in trenches 40 and 45 as shown. In one embodiment, non-conductive material 61 comprises a pair of second non-conductive walls 64 that extend through first tiers 22 and second tiers 20 in a vertical cross-section (e.g., that of FIG. 18 and regardless of whether comprising a cylinder).

Referring to FIGS. 19-22, a first non-conductive cylinder 66 has been formed to extend through first tiers 22 and second tiers 20 radially-inward of second non-conductive cylinder 60 (e.g., directly there-against). In one embodiment, first non-conductive cylinder 66 comprises an insulative cylinder (e.g., 68 or 69) and a semiconductive cylinder (e.g., the other of 68 and 69 that may be directly against one another as shown. Example cylinders 68 and 69 comprise materials 70 and 71, respectively (e.g., one comprising silicon nitride and the other comprising polysilicon), and that may also be formed in trenches 40 and 45. In one embodiment, materials 70 and 71 (if both are present) comprise a pair of first non-conductive walls 72 extending through first tiers 22 and second tiers 20 laterally-inward of second non-conductive walls 64 in the vertical cross-section (e.g., FIGS. 21 and 22; e.g., regardless of whether comprising a cylinder), with second non-conductive walls 64 and first non-conductive walls 66 comprising materials of different compositions relative one another.

Referring to FIGS. 23-27, materials 71, 70, and 61 have been punched-through (e.g., by etching) to stop on lines 80 in trenches 40 and 45. Materials 71, 70, and 61 have also been punched-through in TAV openings 84, with such openings by way of example then being extended (e.g., by etching) to conductor material 44. Thereafter, and in one embodiment, conductive material 73 (e.g., a TiN lining and W core radially-inward thereof) has been formed in TAV openings 84 and in horizontally-elongated trenches 40 (and may so be in trenches 45 if present) at the same time (e.g., to overfill such trenches and openings followed by etch-back at least to the top surfaces of uppermost second tier 20). TAVs 74 of example TAV constructions 75 have thereby been formed. TAVs 74 in some embodiments may be considered as individually comprising a conductive core 76 that extends through first tiers 22 and second tiers 20 into conductor tier 16 that is directly below lowest first tier 22z. In one embodiment, TAV constructions 75 individually have second non-conductive cylinder 60 as comprising a bottom portion 78 that is directly under a bottom 79 of first non-conductive cylinder 66. In one embodiment, TAV constructions 75 individually have second non-conductive walls 64 individually comprising a bottom portion 78 that is directly under a bottom 79 of individual first non-conductive walls 72 in the vertical cross-section. In one embodiment, TAV constructions 75 individually have second non-conductive walls 64 being generally L-shaped or mirror L-shaped in the vertical cross-section thereby having an elevationally-extending stem 82 and a base 78 extending horizontally from a lateral side of stem 82 above a bottom 83 thereof.

Figures 28, 29:
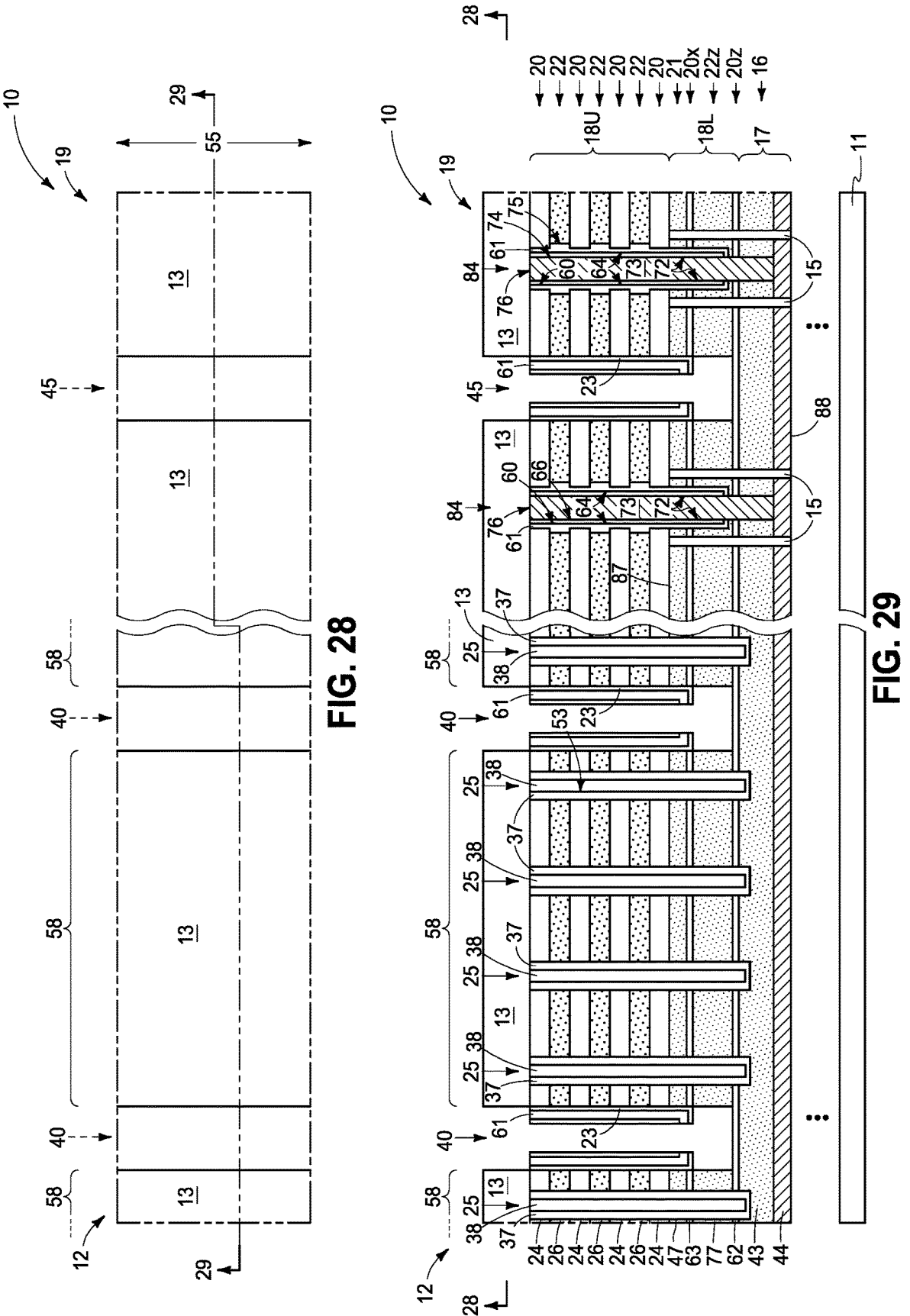

Referring to FIGS. 28 and 29, and in one embodiment, all of conductive material 73 has been removed (e.g., by etching) from horizontally-elongated trenches 40 (as may also be so from trenches 45 when present) while leaving conductive material 73 in TAV openings 84 to leave TAVs 74 therein in what will be a finished circuitry construction. As an example, a masking material 13 has openings there-through over trenches 40 and 45 while other areas thereunder are masked there-by while removing conductive material 73 from trenches 40 and 45. Thereafter, lines 80 (not shown and when present) have been removed (e.g., by etching).

Figures 30, 31:
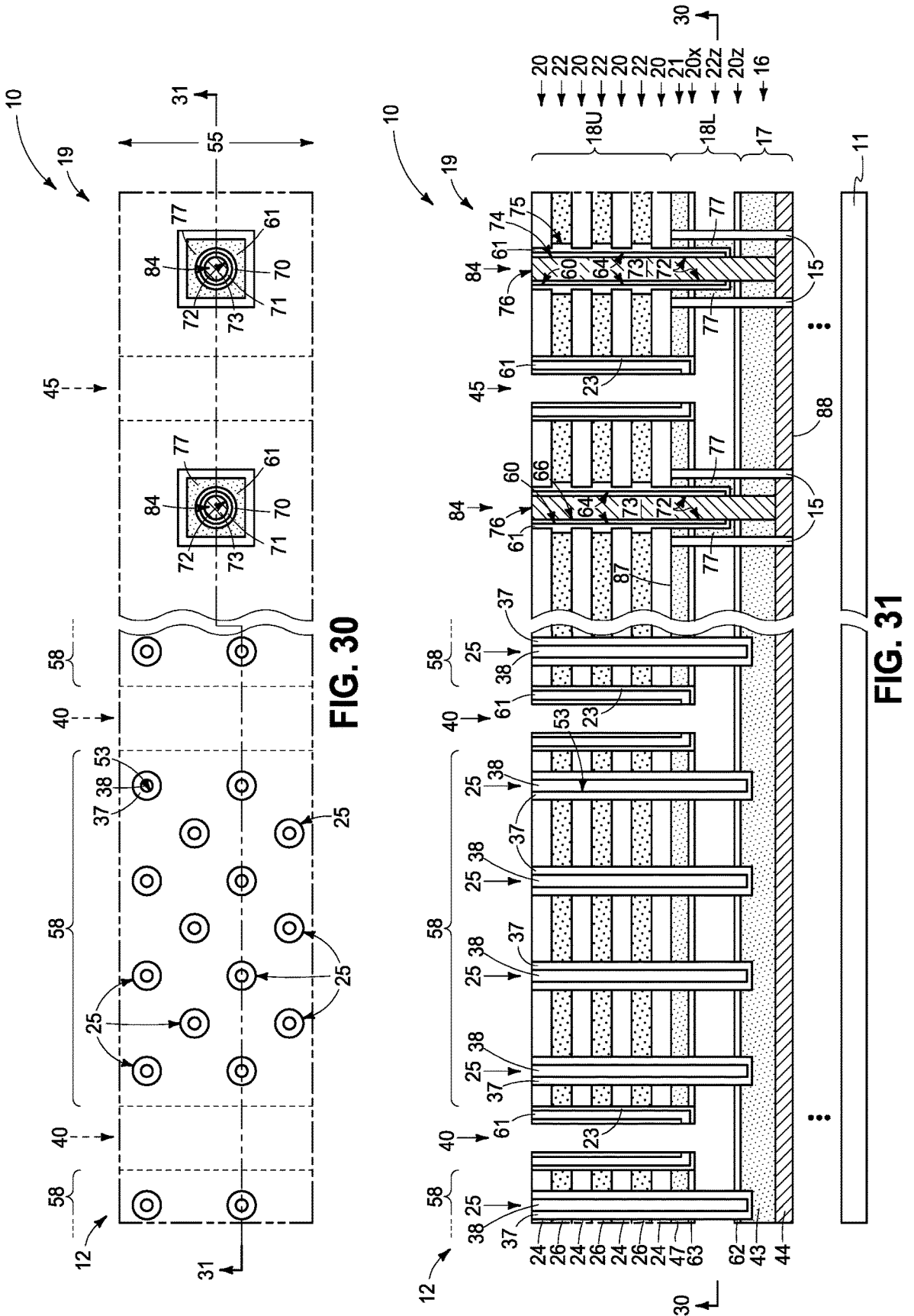

Referring to FIGS. 30 and 31, and in one embodiment, an etching fluid (not shown) has been flowed into horizontally-elongated trenches 40 and 45 to isotropically etch sacrificial material 77 from lowest conductive tier 22z at least in array region 12 (sacrificial material 77 thereby not being shown). Such etching is ideally conducted selectively relative to other exposed materials, for example using liquid or vapor $H_3PO_4$ as a primary etchant where material 77 is silicon nitride or using tetramethyl ammonium hydroxide [TMAH] where material 77 is polysilicon. The artisan is capable of selecting other chemistries for other materials 77. At least some of materials 71, 70, and 61 in trenches 40 and 45 are ideally resistant to the etching fluid used during the flowing. FIGS. 30 and 31 show an embodiment wherein all sacrificial material 77 has also been removed in TAV region 19 (sacrificial material 77 thereby not being shown in TAV region 19 except radially inside of insulative rings 15). Alternately, none or only some of sacrificial material 77 may be removed from TAV region 19 (neither being shown). Whole, partial, or no removal of material 77 in TAV region may be dependent upon presence, size, number, and positioning of etch openings in TAV region 19 (e.g., trench opening(s) 45).

Figures 32, 33:
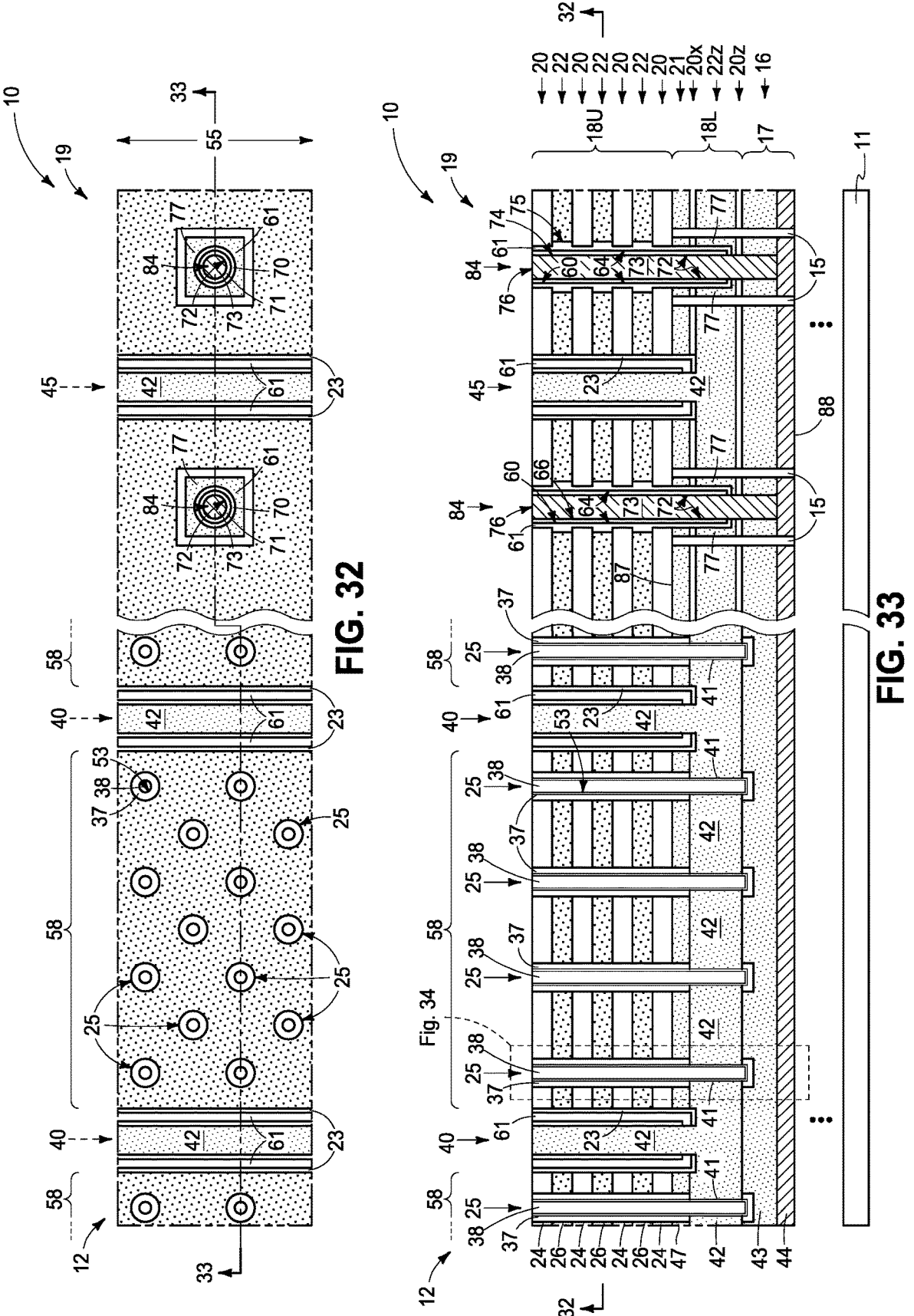
Figure 34:
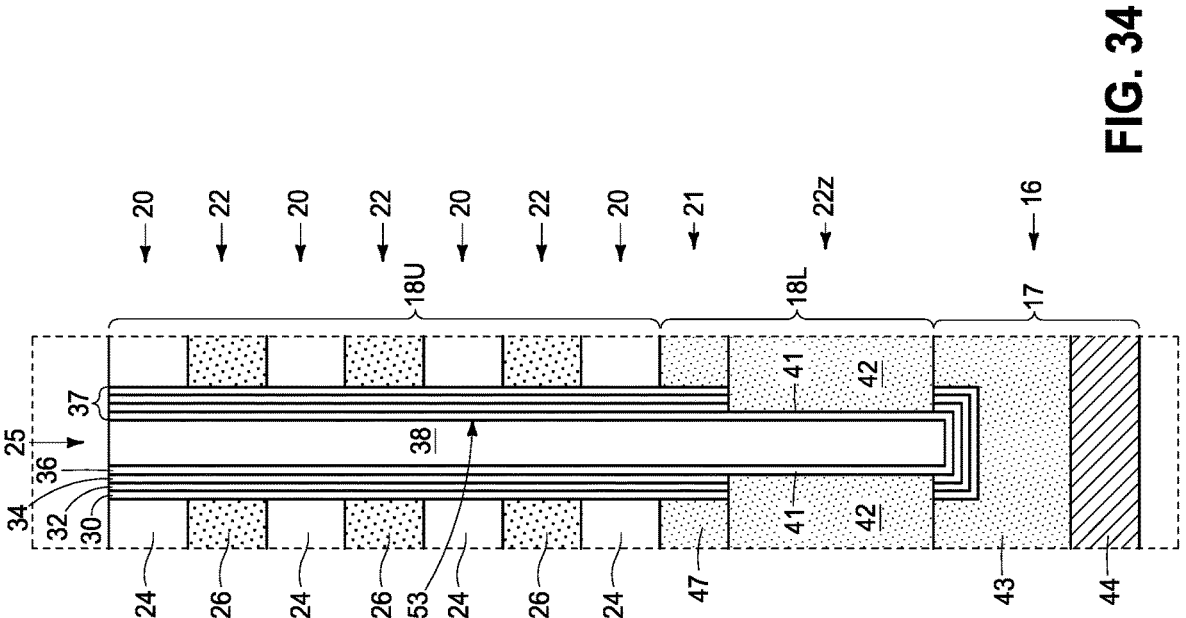

Referring to FIGS. 32-34, and in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where materials 71, 70, and 61 comprise polysilicon or one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to materials 71, 70, and 61 (when present). In one embodiment, materials 62 and 63 (not shown in memory-block regions 58) are also removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. All or some of materials 62 and 63 may also be removed in TAV region 19.

After exposing sidewall 41, conductive material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21.

Figures 35, 36:
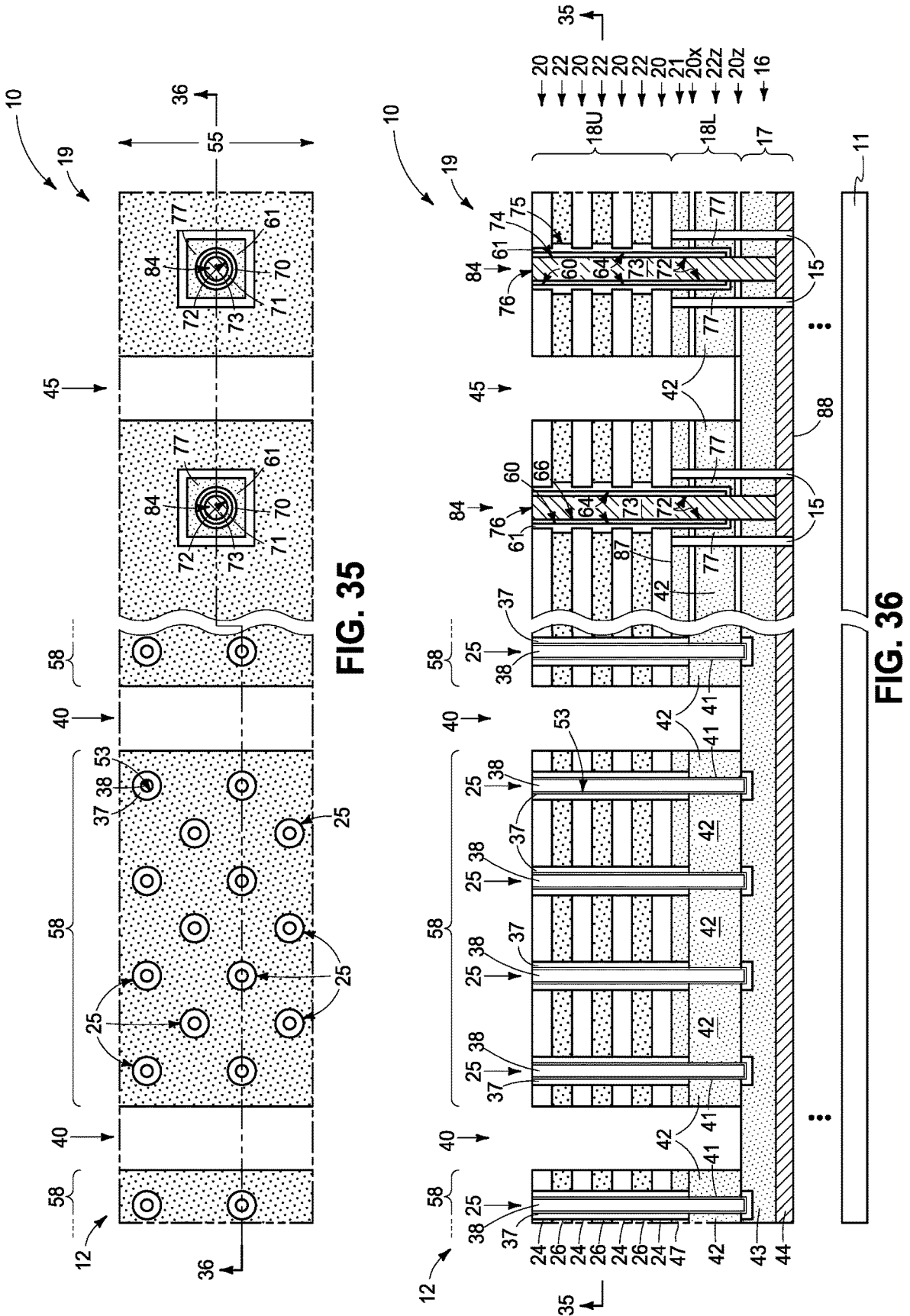
Figures 37, 38:
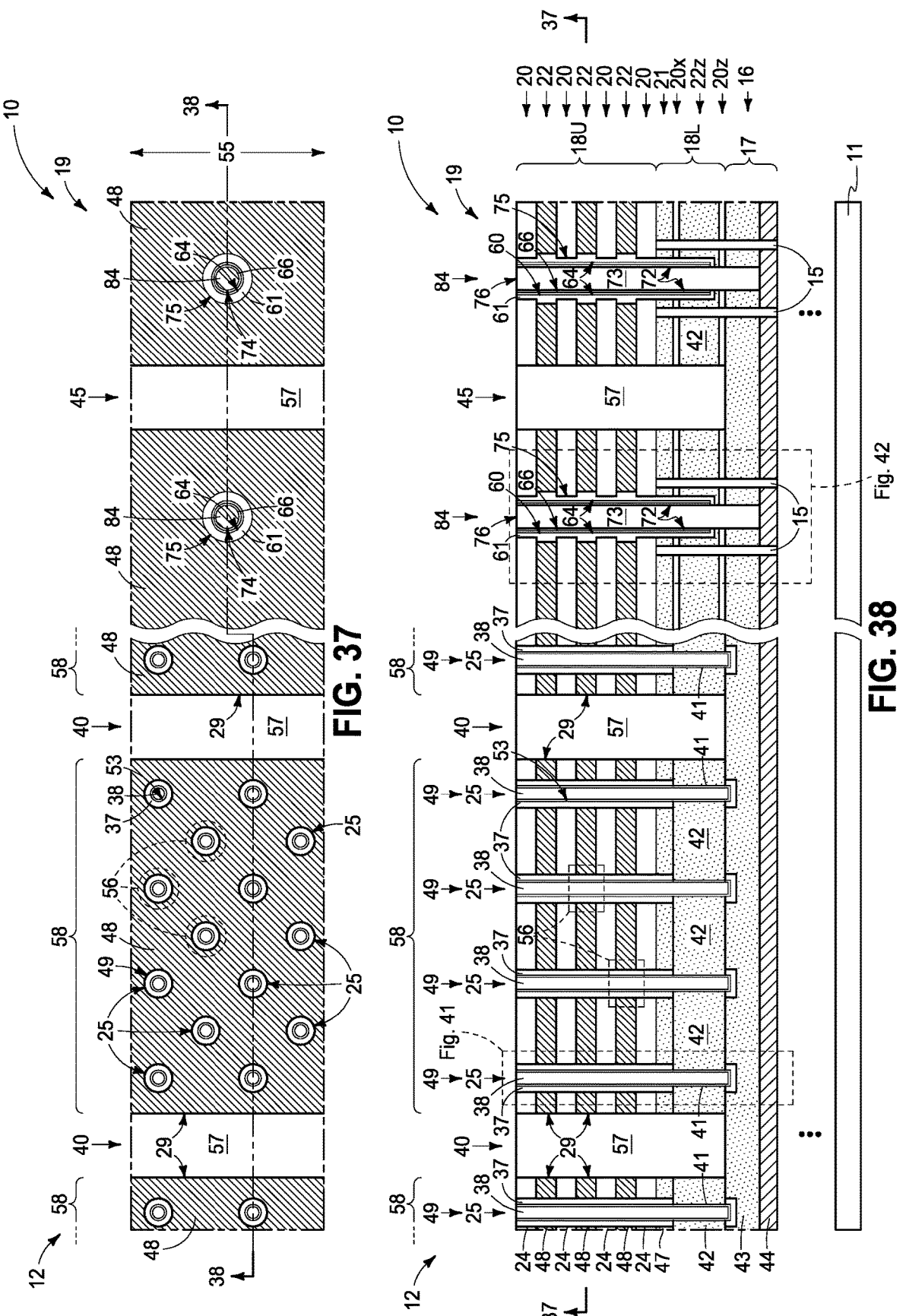
Figure 42:
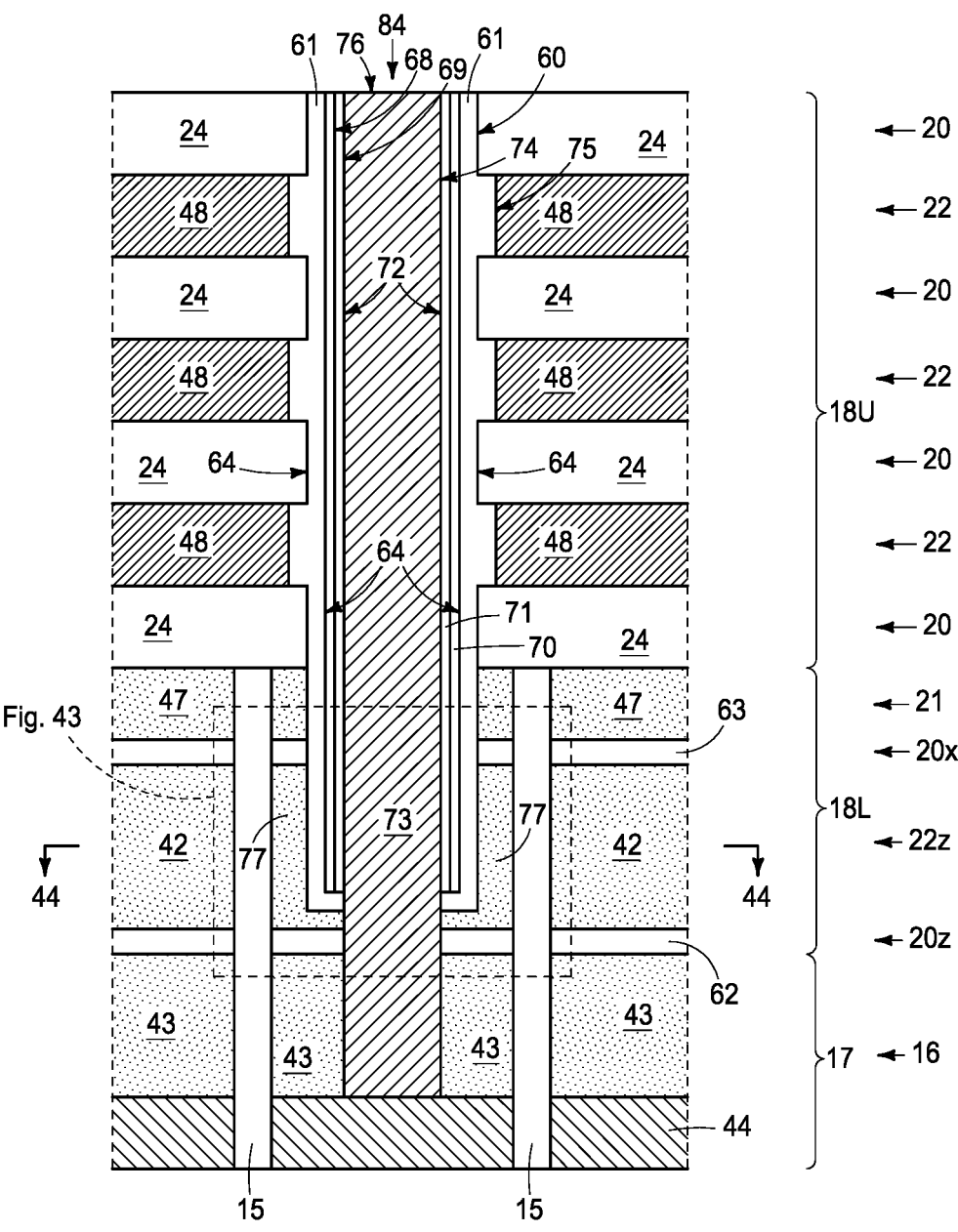
Figure 43:
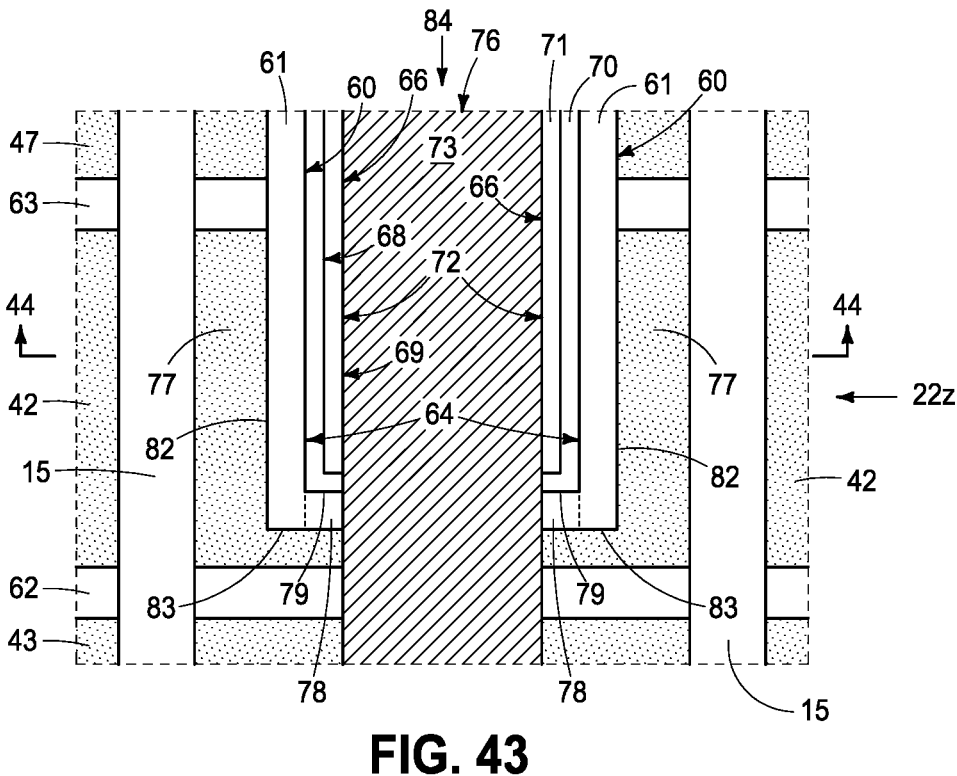
Figure 44:
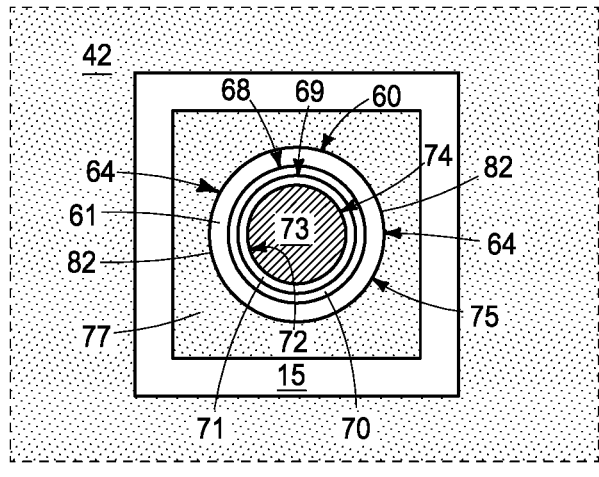

Referring to FIGS. 35 and 36, conductive material 42 has been removed from trenches 40 (and trenches 45 when present) as have materials 71, 70, and 61 (not there-shown). Materials 71, 70, and 61 (when present) may be removed before or after forming conductive material 42. Conductive material 42 and materials 71, 70, and 61 have also been removed from trench 45 (when present, and in one such embodiment). In one embodiment as shown, conducting material 47 of tier 21 and conductive material 42 of tier 22z being directly against one another may collectively be considered as the lowest conductive tier at least in array region 12.

Referring to FIGS. 37-44, material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Some, all, or none of material 26 may be removed from TAV region 19 (removal of all being shown) and replaced with conducting material 48, for example depending on proximity of trenches 40 that are closest thereto, presence or lack thereof of etch-blocking material(s)/structure(s) in tiers 22 in upper portion 18U (not shown), and/or presence of other openings (e.g., trench 45).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally-between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown). In one embodiment and as shown, intervening material 57 has also been formed in trench 45 when present.

Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple to conductor material (e.g., 17) of the conductor tier. A through-array-via (TAV) region (e.g., 19) is included and comprises TAV constructions (e.g., 75). Individual of the TAV constructions comprise a conductive core (e.g., 76) extending through the insulative tiers and the conductive tiers and into the conductor tier. A first non-conductive cylinder (e.g., 66) extends through the insulative tiers and the conductive tiers radially-outward of the conductive core. A second non-conductive cylinder (e.g., 60) extends through the insulative tiers and the conductive tiers radially-outward of the first non-conductive cylinder. The second non-conductive cylinder and the first non-conductive cylinder comprise materials (e.g., 70, 71) of different compositions relative one another. The second non-conductive cylinder comprises a bottom portion (e.g., 78) that is directly under a bottom (e.g., 79) of the first non-conductive cylinder.

In one embodiment, the first non-conductive cylinder is directly against the conductive core. In one embodiment, the first non-conductive cylinder comprises an insulative cylinder and a semiconductive cylinder. In one such embodiment, the insulative cylinder is closer to the conductive core than is the semiconductive cylinder and in another such embodiment the semiconductive cylinder is closer to the conductive core than is the insulative cylinder.

In one embodiment, the bottom portion of the second non-conductive cylinder is everywhere above the conductor tier and, in one such embodiment, such bottom portion is everywhere in a lowest of the conductive tiers (e.g., 22z).

Any other attribute(s) or aspect(s) as shown and/or described herein with respect to other embodiments may be used.

Figure 45:
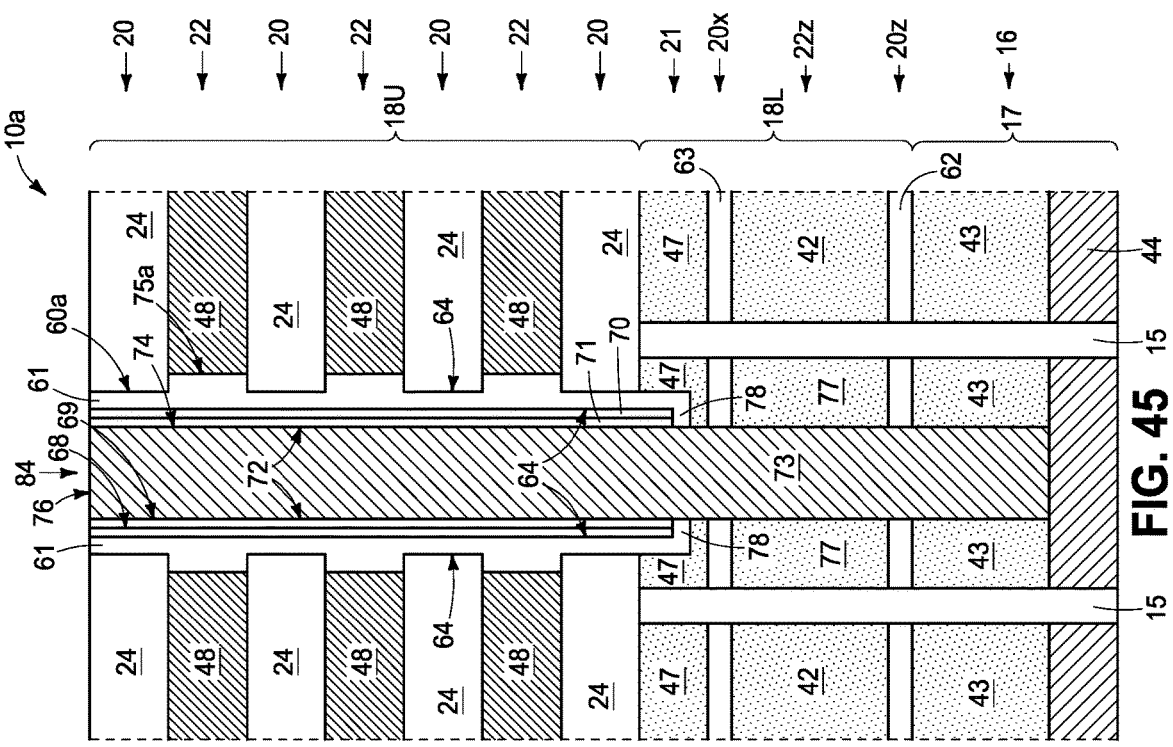

In one embodiment, bottom portion 78 of second non-conductive cylinder 60a is everywhere above lowest conductive tier 22z, for example as shown with respect to an alternate TAV construction 75a in a construction 10a in FIG. 45. Like numerals from the above-described embodiments have been used where appropriate, with some construction differences being indicated with the suffix "a" or with different numerals. Any other attribute(s) or aspect(s) as shown and/or described herein with respect to other embodiments may be used.

Figure 46:
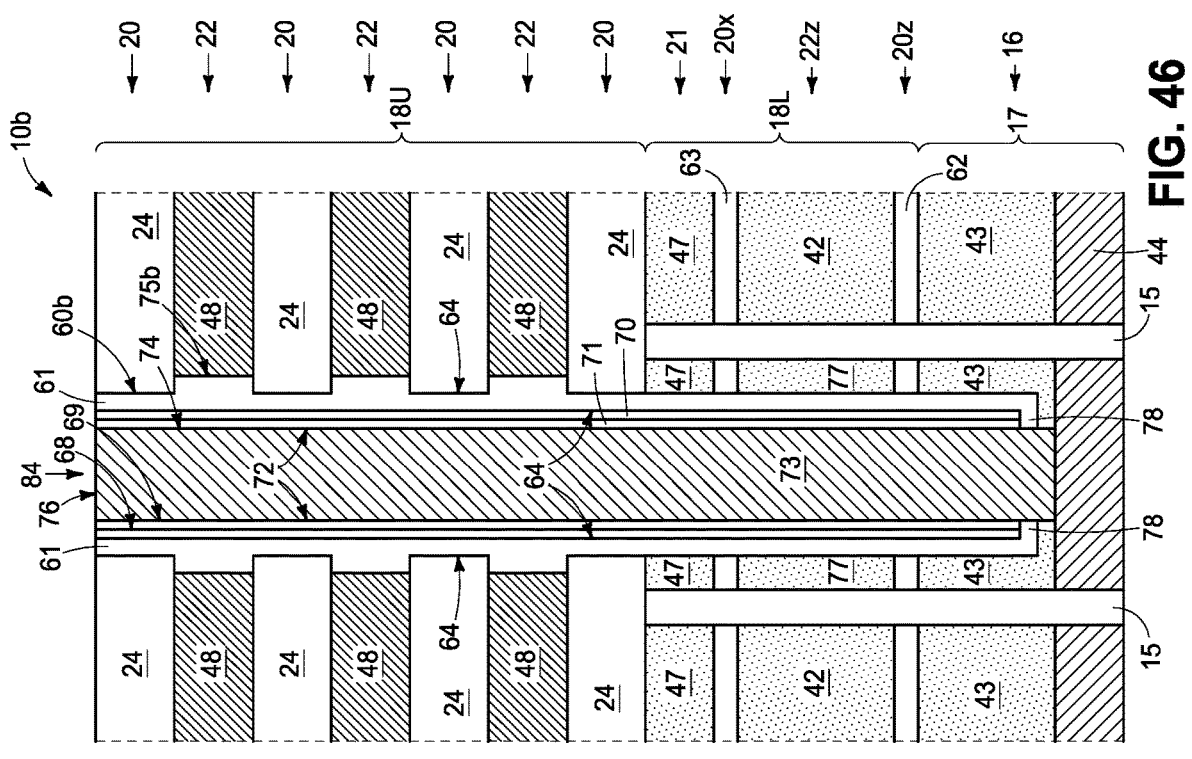

In one embodiment, bottom portion 78 of second non-conductive cylinder 60b is everywhere in conductor tier 16, for example as shown with respect to an alternate TAV construction 75b in a construction 10b in FIG. 46. Like numerals from the above-described embodiments have been used where appropriate, with some construction differences being indicated with the suffix "b" or with different numerals. Any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple to conductor material (e.g., 17) of the conductor tier. A through-array-via (TAV) region (e.g., 19) is included and comprises TAV constructions (e.g., 75). Individual of the TAV constructions comprise a conductive core (e.g., 76) extending through the insulative tiers and the conductive tiers and into the conductor tier in a vertical cross-section. A pair of first non-conductive walls (e.g., 72) extend through the insulative tiers and the conductive tiers laterally-outward of the conductive core in the vertical cross-section. A pair of second non-conductive walls (e.g., 64) extend through the insulative tiers and the conductive tiers laterally-outward of the pair of first non-conductive walls in the vertical cross-section. The second non-conductive walls and the first non-conductive walls comprise materials (e.g., 70, 71) of different compositions relative one another. The second non-conductive walls individually comprise a bottom portion (e.g., 78) that is directly under a bottom (e.g., 79) of individual of the first non-conductive walls in the vertical cross-section. The first and second non-conductive walls may have any of the attributes or aspects described herein with respect to the first and second non-conductive cylinders. Further, any other attribute(s) or aspect(s) as shown and/or described herein with respect to other embodiments may be used.

In one embodiment, a memory array (e.g., 12) comprising strings (e.g., 49) of memory cells (e.g., 56) comprises a vertical stack (e.g., 18*) comprising alternating insulative tiers (e.g., 20*) and conductive tiers (e.g., 22*) directly above a conductor tier (e.g., 16). Strings (e.g., 49) of memory cells (e.g., 56) comprising channel-material strings (e.g., 53) extend through the insulative tiers and the conductive tiers. The channel-material strings directly electrically couple to conductor material (e.g., 17) of the conductor tier. A through-array-via (TAV) region (e.g., 19) is included and comprises TAV constructions (e.g., 75). Individual of the TAV constructions comprise a conductive core (e.g., 76) extending through the insulative tiers and the conductive tiers and into the conductor tier in a vertical cross-section. A pair of first non-conductive walls (e.g., 72) extend through the insulative tiers and the conductive tiers laterally-outward of the conductive core in the vertical cross-section. A pair of second non-conductive walls (e.g., 64) extend through the insulative tiers and the conductive tiers laterally-outward of the pair of first non-conductive walls in the vertical cross-section. The second non-conductive walls and the first non-conductive walls comprise materials (e.g., 70, 71) of different compositions relative one another. The second non-conductive walls being generally L-shaped or mirror L-shaped in the vertical cross-section thereby having an elevationally-extending stem (e.g., 82) and a base (e.g., 78) extending horizontally from a lateral side of the stem above a bottom (e.g., 83) of the stem. The first and second non-conductive walls may have any of the attributes or aspects described herein with respect to the first and second non-conductive cylinders. Further, any other attribute(s) or aspect(s) as shown and/or described herein with respect to other embodiments may be used.

Method embodiments of the invention may reduce manufacturing time and/or costs.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. The stack comprises laterally-spaced memory-block regions and a through-array-via (TAV) region. The stack comprises channel-material strings extending through the first tiers and the second tiers. The stack comprises horizontally-elongated trenches extending through the first tiers and the second tiers and that are individually between immediately-laterally-adjacent of the memory-block regions. The stack comprises TAV openings in the TAV region. Conductive material is formed in the TAV openings and in the horizontally-elongated trenches at the same time. All of the conductive material is removed from the horizontally-elongated trenches while leaving the conductive material in the TAV openings to comprise TAVs therein in a finished circuitry construction. After the removing, intervening material is formed in the horizontally-elongated trenches.

In some embodiments, a method used in forming a memory array comprising strings of memory cells comprises forming a stack comprising vertically-alternating first tiers and second tiers. The stack comprises laterally-spaced memory-block regions and a through-array-via (TAV) region. The stack comprises channel-material strings extending through the first tiers and the second tiers. In a common masking step, (a) and (b) are formed at the same time, where, (a): horizontally-elongated trenches through the first tiers and the second tiers that are individually between immediately-laterally-adjacent of the memory-block regions; and (b): TAV openings through the first tiers and the second tiers in the TAV region. A lining is formed over sidewalls of the horizontally-elongated trenches while the TAV openings are masked to preclude forming of the lining over sidewalls of the TAV openings. The TAV openings are unmasked and thereafter conductive material is formed therein and TAVs are formed therefrom.

In some embodiments, a method used in forming a memory array comprising strings of memory cells comprises forming a vertical stack comprising alternating first tiers and second tiers directly above a conductor tier. Strings of memory cells comprise channel-material strings that extend through the first tiers and the second tiers. The channel-material strings directly electrically couple to conductor material of the conductor tier. TAV constructions are formed in a through-array-via (TAV) region. Individual of the TAV constructions comprise a conductive core extending through the first tiers and the second tiers and into the conductor tier. A first non-conductive cylinder extends through the first tiers and the second tiers radially-outward of the conductive core. A second non-conductive cylinder extends through the first tiers and the second tiers radially-outward of the first non-conductive cylinder. The second non-conductive cylinder and the first non-conductive cylinder comprise materials of different compositions relative one another. The second non-conductive cylinder comprises a bottom portion that is directly under a bottom of the first non-conductive cylinder.

In some embodiments, a memory array comprising strings of memory cells comprises a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAV constructions. Individual of the TAV constructions comprise a conductive core extending through the insulative tiers and the conductive tiers and into the conductor tier. A first non-conductive cylinder extends through the insulative tiers and the conductive tiers radially-outward of the conductive core. A second non-conductive cylinder extends through the insulative tiers and the conductive tiers radially-outward of the first non-conductive cylinder. The second non-conductive cylinder and the first non-conductive cylinder comprise materials of different compositions relative one another. The second non-conductive cylinder comprises a bottom portion that is directly under a bottom of the first non-conductive cylinder.

In some embodiments, a memory array comprising strings of memory cells comprises a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAV constructions. Individual of the TAV constructions comprise a conductive core extending through the insulative tiers and the conductive tiers and into the conductor tier in a vertical cross-section. A pair of first non-conductive walls extend through the insulative tiers and the conductive tiers laterally-outward of the conductive core in the vertical cross-section. A pair of second non-conductive walls extend through the insulative tiers and the conductive tiers laterally outward of the pair of first non-conductive walls in the vertical cross-section. The second non-conductive walls and the first non-conductive walls comprise materials of different compositions relative one another. The second non-conductive walls individually comprise a bottom portion that is directly under a bottom of individual of the first non-conductive walls in the vertical cross-section.

In some embodiments, a memory array comprising strings of memory cells comprises a vertical stack comprising alternating insulative tiers and conductive tiers directly above a conductor tier. Strings of memory cells comprise channel-material strings that extend through the insulative tiers and the conductive tiers. The channel-material strings directly electrically couple to conductor material of the conductor tier. A through-array-via (TAV) region comprises TAV constructions. Individual of the TAV constructions comprises a conductive core extending through the insulative tiers and the conductive tiers and into the conductor tier in a vertical cross-section. A pair of first non-conductive walls extend through the insulative tiers and the conductive tiers laterally-outward of the conductive core in the vertical cross-section. A pair of second non-conductive walls extend through the insulative tiers and the conductive tiers laterally-outward of the pair of first non-conductive walls in the vertical cross-section. The second non-conductive walls and the first non-conductive walls comprise materials of different compositions relative one another. The second non-conductive walls are generally L-shaped or mirror L-shaped in the vertical cross-section thereby have an elevationally-extending stem and a base extending horizontally from a lateral side of the stem above a bottom of the stem.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:

forming a stack comprising vertically-alternating first tiers and second tiers, the stack comprising laterally-spaced memory-block regions and a through-array-via (TAV) region, the stack comprising channel-material strings extending through the first tiers and the second tiers, the stack comprising horizontally-elongated trenches extending through the first tiers and the second tiers and that are individually between immediately-laterally-adjacent of the memory-block regions, the stack comprising TAV openings in the TAV region, the TAV openings and the horizontally-elongated trenches being formed at the same time using a common masking step;

forming conductive material in the TAV openings and in the horizontally-elongated trenches at the same time;

removing all of the conductive material from the horizontally-elongated trenches while leaving the conductive material in the TAV openings to comprise TAVs therein in a finished circuitry construction; and after the removing, forming intervening material in the horizontally-elongated trenches.

2. The method of claim 1, wherein the TAVs are individually formed to comprise a conductive core extending through the first tiers and the second tiers into a conductor tier that is directly below a lowest of the first tiers; and further comprising:

forming a first non-conductive cylinder extending through the first tiers and the second tiers and that is radially-outward of the conductive core in the finished circuitry construction;

forming a second non-conductive cylinder extending through the first tiers and the second tiers and that is radially-outward of the first non-conductive cylinder in the finished circuitry construction, the second non-conductive cylinder and the first non-conductive cylinder comprising materials of different compositions relative one another; and the second non-conductive cylinder comprising a bottom portion that is directly under a bottom of the first non-conductive cylinder.

3. The method of claim 1, wherein the TAVs are individually formed to comprise a conductive core extending through the first tiers and the second tiers and into a conductor tier that is directly below a lowest of the first tiers in a vertical cross-section; and further comprising:

forming a pair of first non-conductive walls extending through the first tiers and the second tiers and that are individually laterally-outward of the conductive core in the vertical cross-section in the finished circuitry construction;

forming a pair of second non-conductive walls extending through the first tiers and the second tiers and that are laterally-outward of the pair of first non-conductive walls in the vertical cross-section in the finished circuitry construction, the second non-conductive walls and the first non-conductive walls comprising materials of different compositions relative one another; and the second non-conductive walls individually comprising a bottom portion that is directly under a bottom of individual of the first non-conductive walls in the vertical cross-section.

4. The method of claim 1, wherein the TAVs are individually formed to comprise a conductive core extending through the first tiers and the second tiers and into a conductor tier that is directly below a lowest of the first tiers in a vertical cross-section; and further comprising:

forming a pair of first non-conductive walls extending through the first tiers and the second tiers and that are individually laterally-outward of the conductive core in the vertical cross-section in the finished circuitry construction;

forming a pair of second non-conductive walls extending through the first tiers and the second tiers and that are laterally-outward of the pair of first non-conductive walls in the vertical cross-section in the finished circuitry construction, the second non-conductive walls and the first non-conductive walls comprising materials of different compositions relative one another; and the second non-conductive walls being generally L-shaped or mirror L-shaped in the vertical cross-section thereby having an elevationally-extending stem and a base extending horizontally from a lateral side of the stem above a bottom of the stem.

5. A method used in forming a memory array comprising strings of memory cells, comprising:

forming a stack comprising vertically-alternating first tiers and second tiers, the stack comprising laterally-spaced memory-block regions and a through-array-via (TAV) region, the stack comprising channel-material strings extending through the first tiers and the second tiers;

in a common masking step, forming (a) and (b) at the same time, where, (a): horizontally-elongated trenches through the first tiers and the second tiers that are individually between immediately-laterally-adjacent of the memory-block regions; and (b): TAV openings through the first tiers and the second tiers in the TAV region;

forming a lining over sidewalls of the horizontally-elongated trenches while the TAV openings are masked to preclude forming of the lining over sidewalls of the TAV openings; and unmasking the TAV openings and thereafter forming conductive material therein and forming TAVs therefrom.

6. The method of claim 5 comprising etching material of the first tiers from within the TAV openings after the unmasking and before the forming of the conductive material therein, said etching also etching the lining in the horizontally-elongated trenches.

7. The method of claim 6 wherein said etching only etches some of the lining in the horizontally-elongated trenches.

8. The method of claim 5 comprising forming the conductive material in the horizontally-elongated trenches while forming the conductive material in the TAV openings.

9. The method of claim 8 comprising removing all of the conductive material from the horizontally-elongated trenches that was formed while forming the conductive material in the TAV openings.

10. A method used in forming a memory array comprising strings of memory cells, comprising:

forming a vertical stack comprising alternating first tiers and second tiers directly above a conductor tier, strings of memory cells comprising channel-material strings that extend through the first tiers and the second tiers, the channel-material strings directly electrically coupling to conductor material of the conductor tier, the first tiers comprising conductive wordlines in a finished circuitry construction of the memory array, the second tiers comprising insulative material that is vertically between the conductive wordlines of the first tiers in the finished circuitry construction; and forming TAV constructions in a through-array-via (TAV) region, individual of the TAV constructions comprising:

a conductive core extending through the first tiers and the second tiers and into the conductor tier;

a first non-conductive cylinder extending through the first tiers and the second tiers radially-outward of the conductive core;

a second non-conductive cylinder extending through the first tiers and the second tiers radially-outward of the first non-conductive cylinder, the second non-conductive cylinder and the first non-conductive cylinder comprising materials of different compositions relative one another, the second non-conductive cylinder projecting laterally into individual of the conductive worldlines in individual of the first tiers in the finished circuitry construction and not projecting laterally into the insulative material of individual of the second tiers in the finished circuitry construction; and the second non-conductive cylinder comprising a bottom portion that is directly under a bottom of the first non-conductive cylinder.

* * * * *